US011327111B2

(12) United States Patent
Tsai et al.

(10) Patent No.: US 11,327,111 B2
(45) Date of Patent: May 10, 2022

(54) ENVIRONMENT CONTROL APPARATUS AND CHIP TESTING SYSTEM

(71) Applicant: ONE TEST SYSTEMS, Santa Clara, CA (US)

(72) Inventors: Chen-Lung Tsai, Saratoga, CA (US); Gene Rosenthal, Santa Cruz, CA (US)

(73) Assignee: ONE TEST SYSTEMS

( * ) Notice: Subject to any disclaimer, the term of this patent is extended or adjusted under 35 U.S.C. 154(b) by 15 days.

(21) Appl. No.: 17/106,186

(22) Filed: Nov. 30, 2020

(65) Prior Publication Data

US 2021/0364568 A1   Nov. 25, 2021

(30) Foreign Application Priority Data

May 22, 2020 (TW) .................. 109117014

(51) Int. Cl.
*G01R 31/28* (2006.01)
(52) U.S. Cl.
CPC ..... *G01R 31/2863* (2013.01); *G01R 31/2874* (2013.01)
(58) Field of Classification Search
CPC ............... G01R 31/28; G01R 31/2862; G01R 31/2863; G01R 31/2868; G01R 31/2872; G01R 31/2873; G01R 31/2874; G01R 31/2875; G01R 31/2877; G01R 31/2881
USPC ....................................... 324/756.02
See application file for complete search history.

(56) References Cited

U.S. PATENT DOCUMENTS

| 10,726,183 | B1* | 7/2020 | Tsai | ............... | G01R 31/2863 |
| 2021/0020260 | A1* | 1/2021 | Tsai | ............... | G11C 29/56016 |
| 2021/0132140 | A1* | 5/2021 | Tsai | ............... | G01R 1/0458 |
| 2021/0132142 | A1* | 5/2021 | Tsai | ............... | G01R 31/2874 |

* cited by examiner

*Primary Examiner* — Jermele M Hollington
*Assistant Examiner* — Courtney G McDonnough
(74) *Attorney, Agent, or Firm* — Li & Cai Intellectual Property Office

(57) ABSTRACT

A chip testing system and an environment control apparatus are provided. The chip testing system includes the environment control apparatus, a central control device, and a chip testing device. The environment control apparatus includes an apparatus body and a pressing device. When the chip testing device is disposed in an accommodating chamber of the apparatus body, and the central control device controls the pressing device to press a plurality of side surfaces of a plurality of chips carried by the chip testing device, the central control device controls the chip testing device to perform a testing operation to the chips. After the chip testing device performs the testing operation to the chips, a plurality of movable members of the pressing device protrude from a contacting surface of the pressing device and push the chips to separate the chips and the contacting surface.

19 Claims, 26 Drawing Sheets

ENVIRONMENT CONTROL APPARATUS AND CHIP TESTING SYSTEM

CROSS-REFERENCE TO RELATED PATENT APPLICATION

This application claims the benefit of priority to Taiwan Patent Application No. 109117014, filed on May 22, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an environment control apparatus and a chip testing system, and more particularly to an environment control apparatus and a chip testing system applicable to test a semiconductor device (e.g., memory chip).

BACKGROUND OF THE DISCLOSURE

Generally, in various types of conventional chip testing operations, a related pressing device is used to press a plurality of chips so as to ensure that the chips are electrically connected to a plurality of electrical connection sockets during the conventional chip testing operations. In a practical application, after the conventional chip testing operation is finished on the chips, an issue of the chips adhering to the pressing device easily occurs. When this issue occurs, it must be manually solved. However, the overall testing operation is accordingly delayed, and when the chips and the pressing device are manually separated, the chips are prone to be damaged from improper operation of related personnel.

SUMMARY OF THE DISCLOSURE

In response to the above-referenced technical inadequacies, the present disclosure provides an environment control apparatus and a chip testing system to improve issues associated with a conventional memory chip testing apparatus (e.g., when the conventional memory chip testing apparatus performs a related testing operation to a plurality of chips disposed in an environment having a predetermined temperature, a related pressing device used to press the chips can easily adhere to the chips).

In one aspect, the present disclosure provides an environment control apparatus including an environment control device, an apparatus body, and a pressing device. The apparatus body includes at least one accommodating chamber. The at least one accommodating chamber is configured to accommodate a chip testing device, the chip testing device is configured to carry a plurality of chips, the environment control device is configured to be electrically connected to the chip testing device disposed in the at least one accommodating chamber, and the environment control device is configured to perform a testing operation to the chips carried by the chip testing device through the chip testing device. The pressing device is disposed in the at least one accommodating chamber. The pressing device includes a contacting structure, a plurality of movable members, and a plurality of retaining members. The contacting structure includes a plurality of move slots. Each of the move slots is formed by a contacting surface of the contacting structure being recessed along a longitudinal direction. Each of the movable members is correspondingly disposed in one of the move slots. One side of each of the movable members opposite to the corresponding move slot has a pushing surface. Each of the movable members is configured to move in the corresponding move slot along the longitudinal direction, and when each of the movable members moves in the corresponding move slot, the pushing surface protrudes from the contacting surface. The retaining members are fixed to the contacting structure. The retaining members are disposed near the move slots, and the retaining members and the contacting structure are configured to jointly limit a range of movement of the plurality of the movable members in the corresponding move slots. When the chip testing device is disposed in the at least one accommodating chamber, the pressing device is correspondingly arranged above the chips carried by the chip testing device. The environment control device is configured to allow the chip testing device disposed in the at least one accommodating chamber and the pressing device arranged in the at least one accommodating chamber to move toward each other, and the environment control device is configured to allow the pushing surfaces of the movable members and the contacting surface to abut against a plurality of side surfaces of the chips together. When the pushing surfaces of the movable members and the contacting surface abut against the side surfaces of the chipstogether, the environment control device is configured to move the chip testing device disposed in the at least one accommodating chamber and the pressing device arranged in the at least one accommodating chamber away from each other, and the movable members correspondingly protrude from the contacting surface and push the chips originally in contact with the contacting surface.

In one aspect, the present disclosure provides a chip testing system including a chip testing device, a central control device, and at least one environment control apparatus. The chip testing device is configured to carry a plurality of chips. The central control device includes at least one environment control device. The at least one environment control apparatus includes an apparatus body and a pressing device. The apparatus body includes at least one accommodating chamber. The at least one accommodating chamber is configured to accommodate a chip testing device, the chip testing device is configured to carry a plurality of chips, the at least one environment control device is configured to be electrically connected to the chip testing device disposed in the at least one accommodating chamber, and the at least one environment control device is configured to perform a testing operation to the chips carried by the chip testing device through the chip testing device. The pressing device is disposed in the at least one accommodating chamber. The pressing device includes a contacting structure, a plurality of movable members, and a plurality of retaining members. The contacting structure includes a plurality of move slots. Each of the move slots is formed by a contacting surface of the contacting structure being recessed along a longitudinal direction. Each of the movable members is correspondingly disposed in one of the move slots. One side of each of the movable members opposite to the corresponding move slot has a pushing surface. Each of the movable members is configured to move in the corresponding move slot along the longitudinal direction, and when each of the movable members moves in the corresponding move slot, the pushing surface of each of the movable members protrudes from the contacting surface. The retaining members are fixed to the contacting structure. The retaining members are disposed near the move slots, and the retaining members and the contacting structure are configured to jointly limit a range of movement of the plurality of the movable members in the corresponding move slots. When the chip testing device is disposed in the at least one accommodating chamber, the pressing device is correspondingly arranged above the chips carried by the chip testing device. The at least one environment control device is configured to allow the chip testing device disposed in the at least one accommodating chamber and the pressing device arranged in the at least one accommodating chamber to move toward each other, and the at least one environment control device is configured to allow the pushing surfaces of the movable members and the contacting surface to abut against a plurality of side surfaces of the chipstogether. When the pushing surfaces of the movable members and the contacting surface abut against the side surfaces of the chips together, the at least one environment control device is configured to move the chip testing device disposed in the at least one accommodating chamber and the pressing device arranged in the at least one accommodating chamber away from each other, and the movable members correspondingly protrude from the contacting surface and push the chips originally in contact with the contacting surface. When the chip testing device is disposed in the at least one of the accommodating chamber and the pushing surfaces of the movable members and the contacting surface abut against the side surface of the chips together, the central control device is configured to control the chip testing device to perform a predetermined testing process to the chips.

Therefore, the environment control apparatus and the chip testing system of the present disclosure include the effects as follows. Through the design of the contacting structure, the movable members, and the retaining members, when the pressing structure presses the chips, the chip testing device has finished performing the predetermined testing process to the chips, and the pressing device and the chip testing device are separated from each other, the movable members protrude from the contacting surface of the contacting structure and push the chips so that the issue of the chips adhering to the contacting surface can be improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
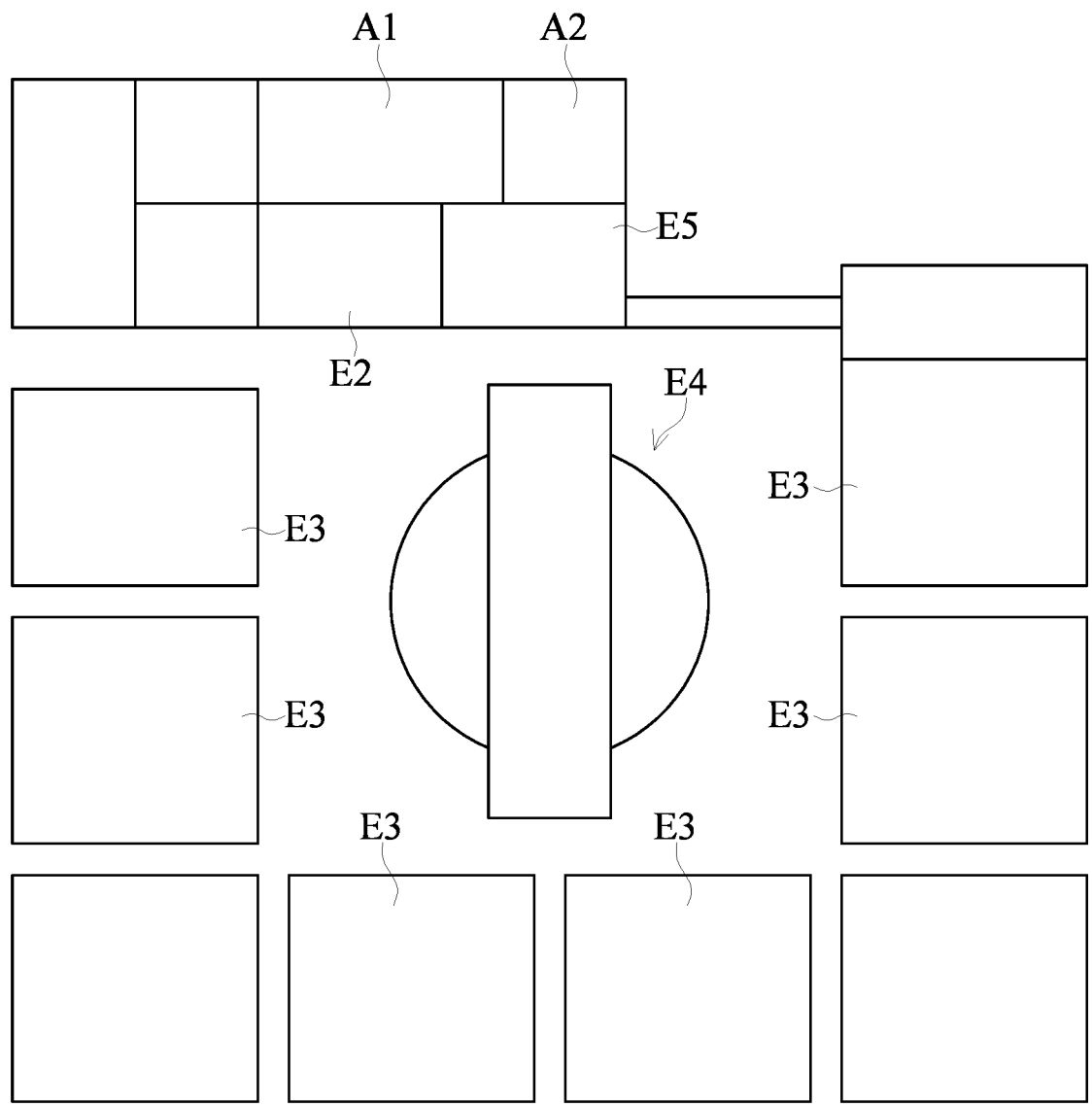
FIG. 1 is a schematic view of a chip testing system of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
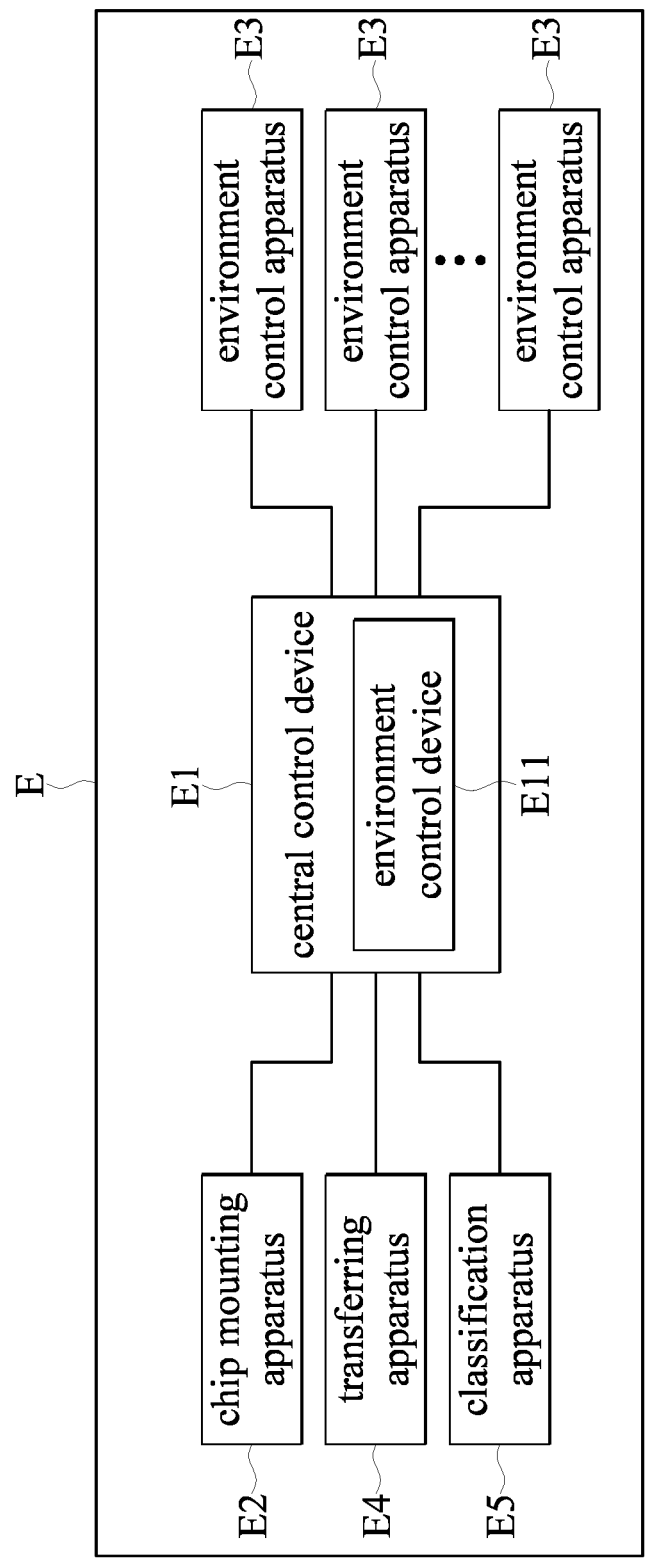
FIG. 2 is a block diagram of the chip testing system of the present disclosure.
Figure 3:
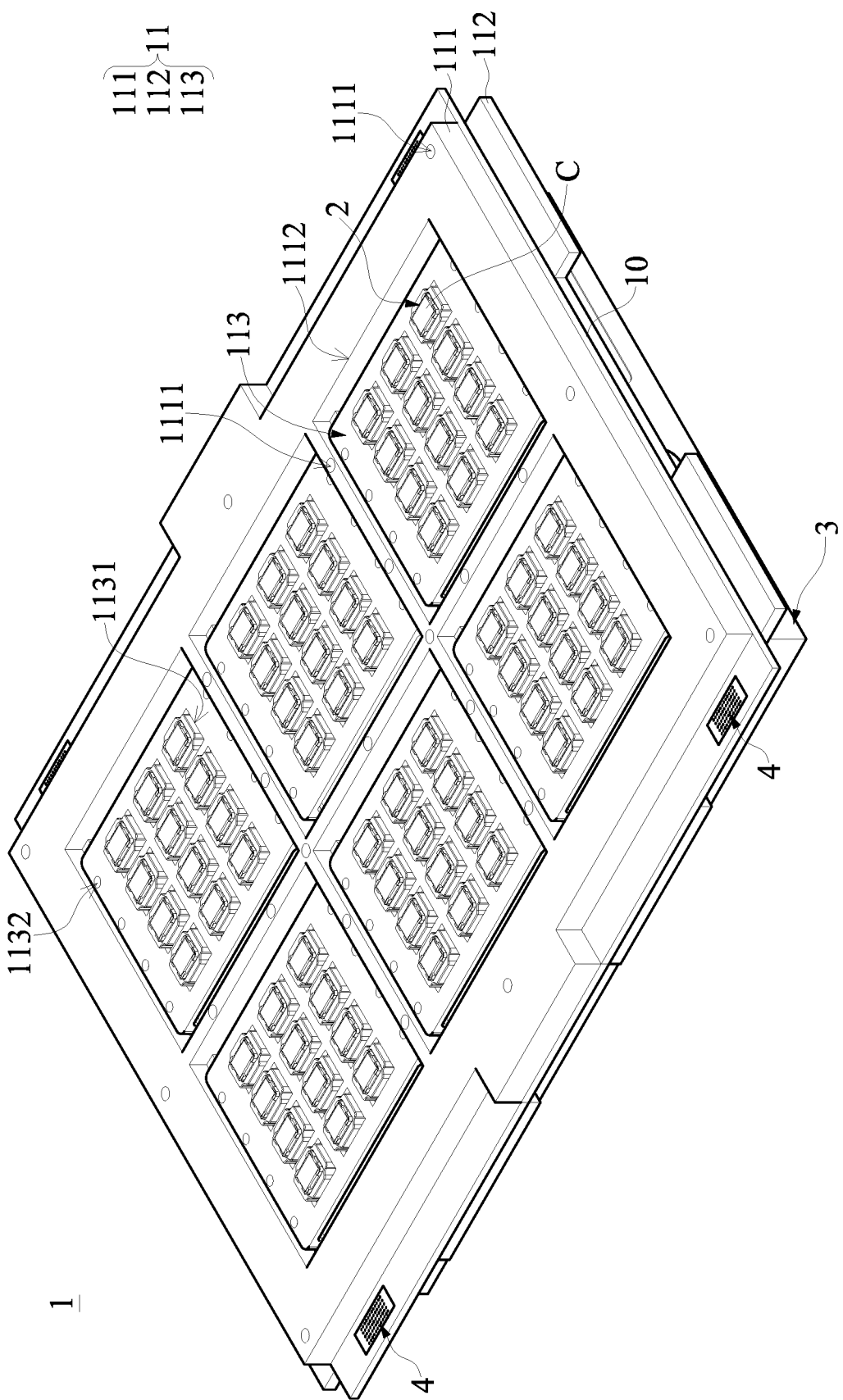
FIG. 3 is a schematic view of a chip testing device having a plurality of chips disposed thereon of the present disclosure.

Referring to FIG. 1 to FIG. 5, FIG. 1 is a schematic view of a chip testing system of the present disclosure, FIG. 2 is a block diagram of the chip testing system of the present disclosure, and FIG. 3 is a schematic view of a chip testing device having a plurality of chips disposed thereon of the present disclosure. A chip testing system E of the present disclosure is configured to test a plurality of chips C. The chip testing system E includes a central control apparatus E1, a chip mounting apparatus E2, at least one chip testing device 1, a plurality of environment control apparatuses E3, a transferring apparatus E4, and a classification apparatus E5.

The central control device E1 is connected to the chip mounting apparatus E2, the environment control apparatuses E3, the transferring apparatus E4, and the classification apparatus E5, and the central control device E1 can control the above apparatuses to be operated. The central control device E1 can be a server or various types of computers, and the present disclosure is not limited thereto. The chip mounting apparatus E2 can include a robot arm (not shown), the robot arm can be controlled by the central control device E1 to take the chips C one by one disposed on a tray and can dispose the chips one by one onto a plurality of electrical connection sockets 2 of the chip testing device 1. The chip testing device 1 is configured to carry the chips C, and the chip testing device 1 can be transferred among a plurality of working stations (e.g., the chip mounting apparatus E2, the environment control apparatuses E3, the transferring apparatus E4, and the classification apparatus E5) by the transferring apparatus E4. The environment control apparatuses E3 are connected to the central control device E1, and the central control device E1 can control any one of the environment control apparatuses E3 to be individually operated. Each of the environment control apparatuses E3 is configured to enable the chips C disposed on the chip testing device 1 to have a predetermined testing process performed in an environment having a predetermined temperature (e.g., a predetermined high temperature or a predetermined low temperature). For example, the chips C can be various types of memory chips (e.g., NAND Flash memory chip), and each of a plurality of testing modules 30 can test at least one of the memory chips by at least one of a reading test, a writing test, and an electrical property test.

Figure 4:
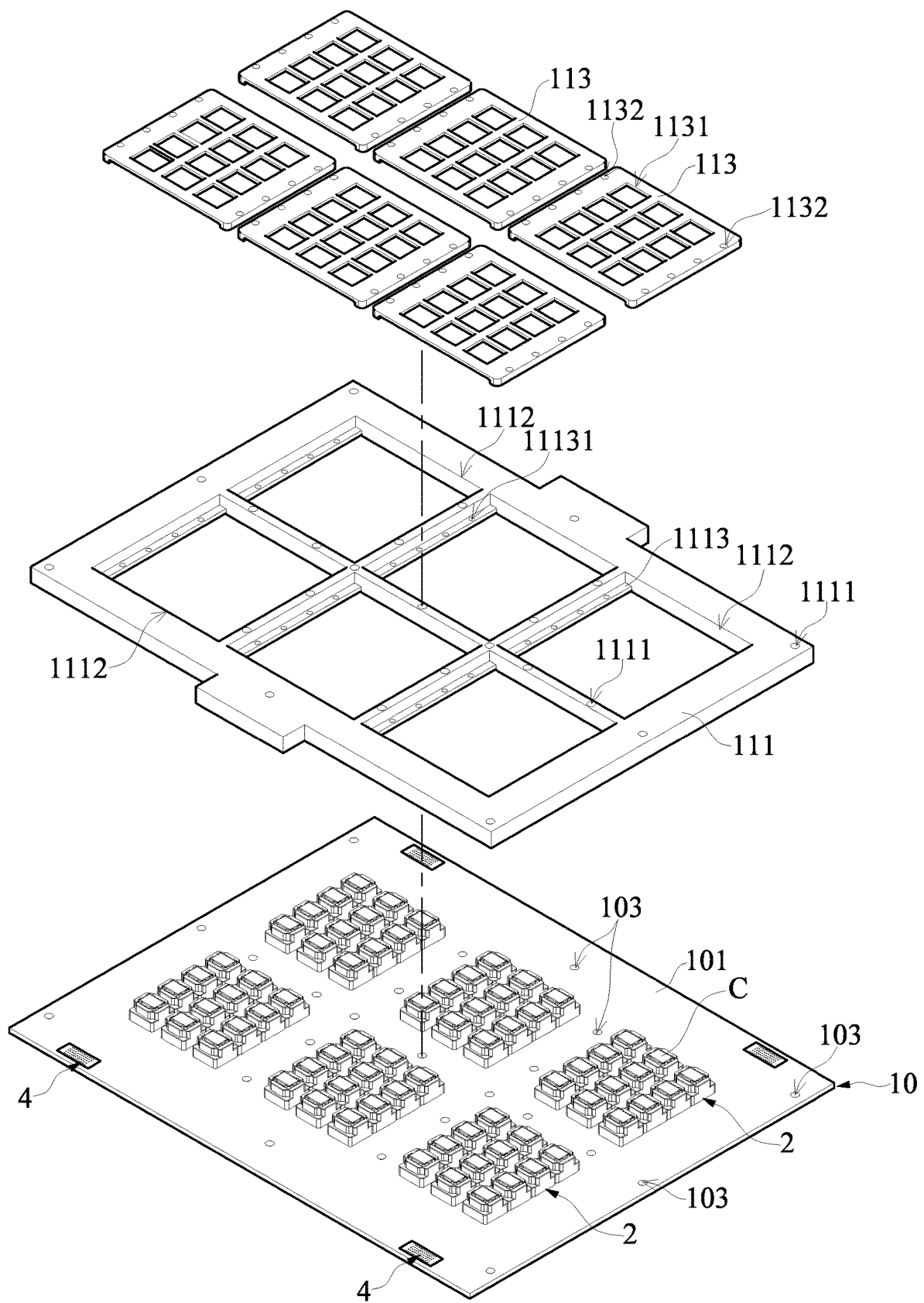
FIG. 4 and FIG. 5 are exploded views of a chip testing device from different angles of the present disclosure.
Figure 5:
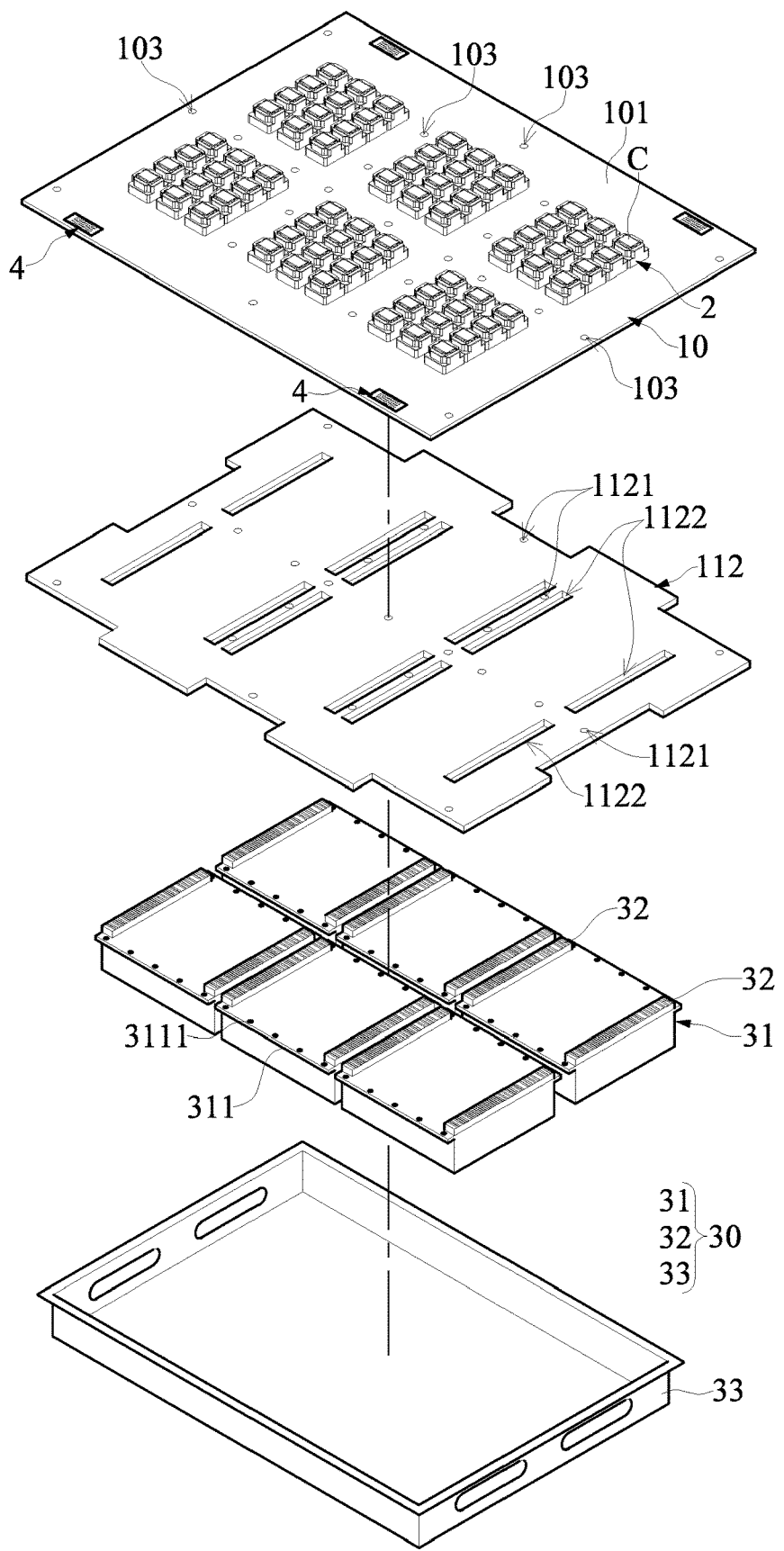
Figure 6:
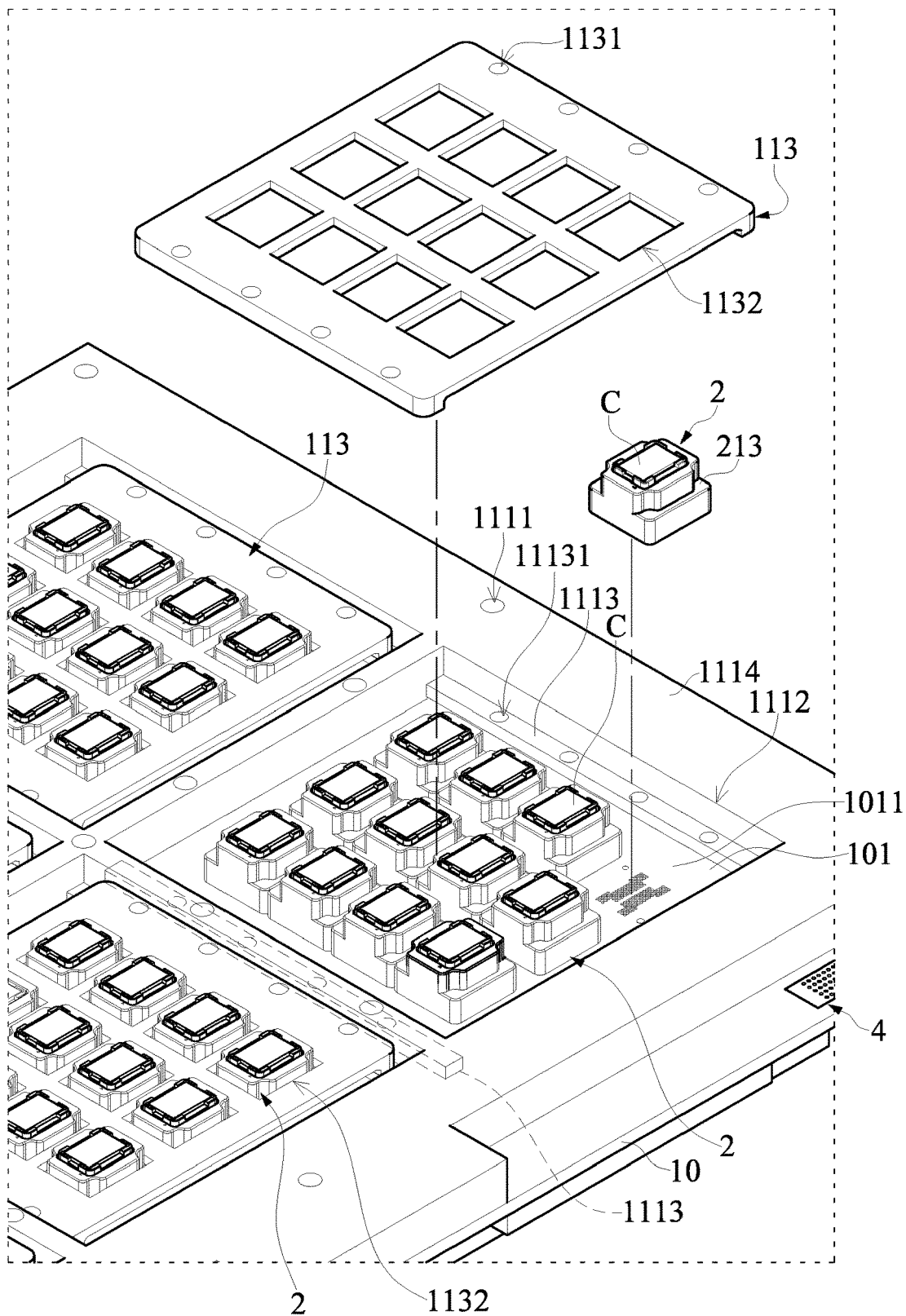
FIG. 6 and FIG. 7 are partially exploded views of the chip testing device from different angles of the present disclosure.
Figure 7:
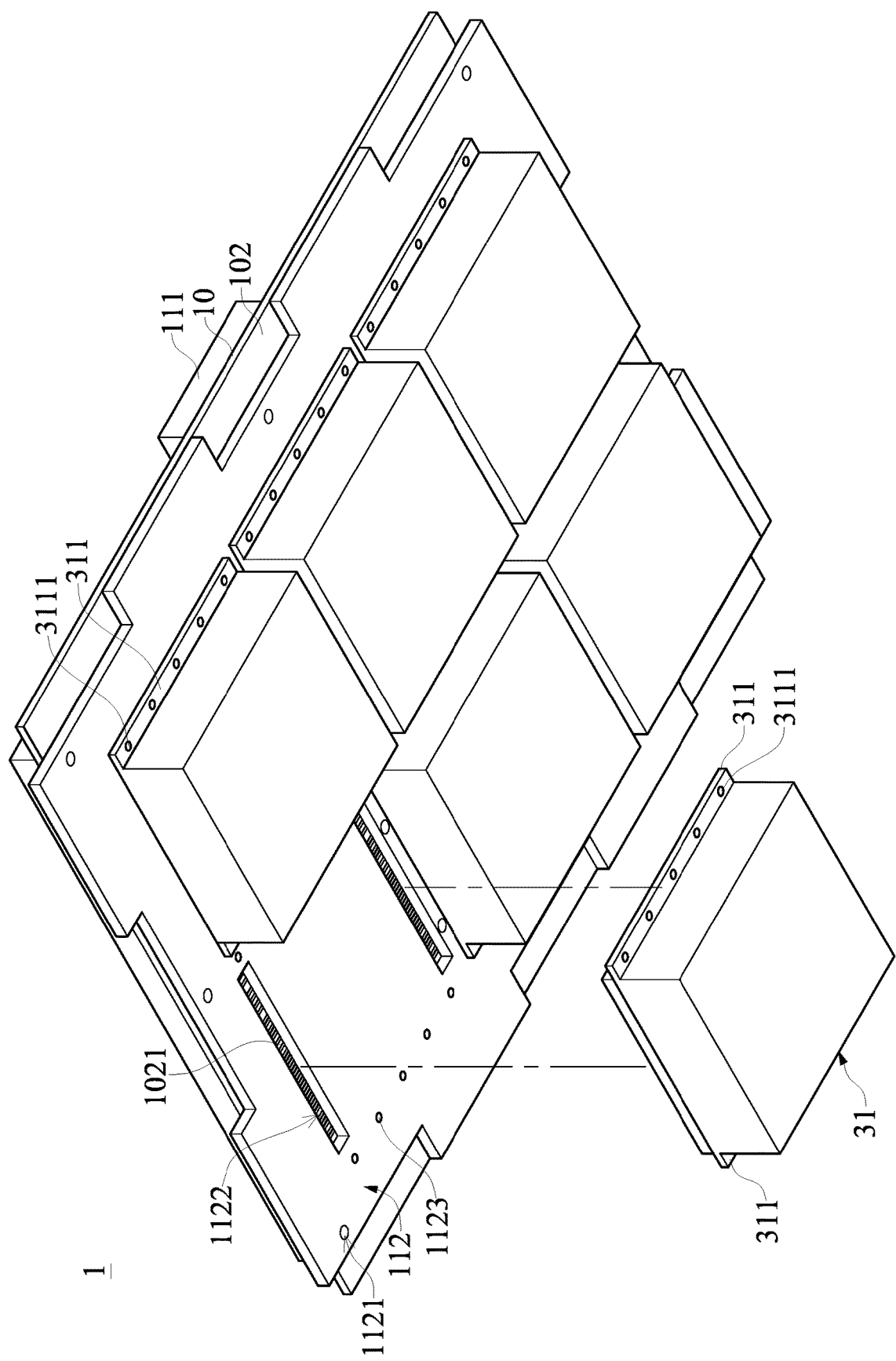
Figure 8:
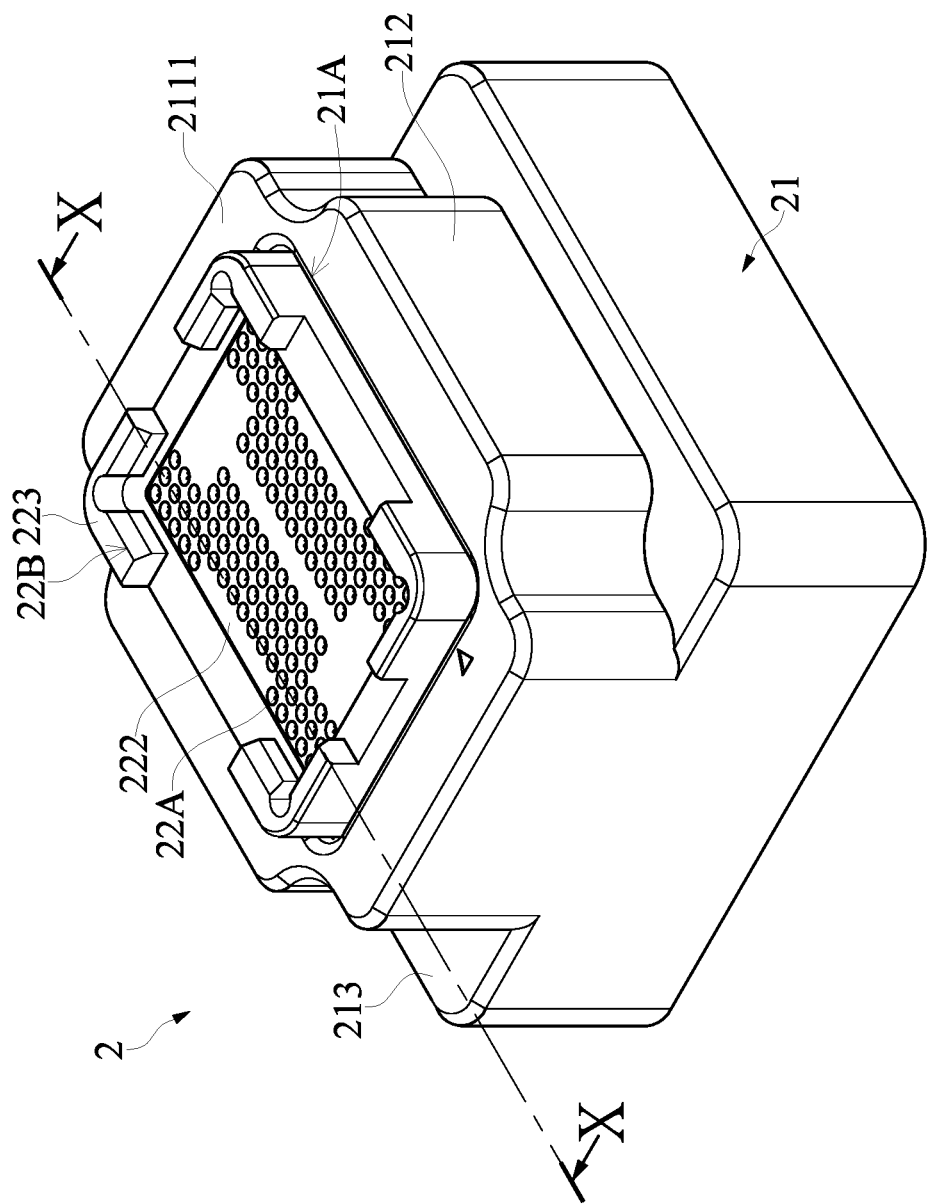
FIG. 8 is a block diagram of the chip testing device of the present disclosure.

Referring to FIG. 3 to FIG. 8, FIG. 3 is a schematic view of a chip testing device having a plurality of chips disposed thereon of the present disclosure, FIG. 4 and FIG. 5 are exploded views of a chip testing device from different angles of the present disclosure, FIG. 6 and FIG. 7 are partially exploded views of the chip testing device from different angles of the present disclosure, and FIG. 8 is a block diagram of the chip testing device of the present disclosure. The chip testing apparatus 1 includes a circuit board 10, a fixing assembly 11, a plurality of electrical connection sockets 2, a control set 3, and at least one first power supply member 4. The circuit board 10 has a first board surface 101 and a second board surface 102 (as shown in FIG. 7) respectively defined by two opposite sides thereof. The electrical connection sockets 2 are fixed onto the first board surface 101 of the circuit board 10, and each of the electrical connection sockets 2 is configured to carry one of the chips C. The structure of the electrical connection sockets 2 can be changed according to different chips C, and the present disclosure is not limited thereto.

The fixing assembly 11 includes a first fixing member 111, a second fixing member 112, and a plurality of pressing structures 113. The first fixing member 111 is disposed on the first board surface 101, and the second fixing member is disposed on the second board surface 102. The first fixing member 111 includes a plurality of first screwing holes 1111, the second fixing member 112 includes a plurality of second screwing holes 1121, and the circuit board 10 includes a plurality of circuit board screwing holes 103. Each of the first screwing holes 1111 penetrates through the first fixing member 111, each of the second screwing holes 1121 penetrates through the second fixing member 112, each of the circuit board screwing holes 103 penetrates through the circuit board 10, and the first screwing holes 1111, the circuit board screwing holes 103, and the second screwing holes 1121 are correspondingly disposed. In a practical application, the quantity, structure, and disposed positions of the first screwing holes 1111, the circuit board screwing holes 103, and the second screwing holes 1121 can be changed according to practical requirements, and FIG. 3 to FIG. 7 only show one embodiment of the present disclosure.

The first screwing holes 1111, the circuit board screwing holes 103, and the second screwing holes 1121 are configured to be screwed with a plurality of screwing members (not shown, e.g., screws), and the circuit board 10 is fixed between the first screwing member 111 and the second screwing member 112. In other words, the circuit board 10 is held between the first screwing member 111 and the second screwing member 112, and an overall structure of the circuit board 10 is strengthened through the first screwing member 111 and the second screwing member 112. In a practical application, the first screwing member 111 and the second screwing member 112 can be made of a material having a high hardness (e.g., stainless steel). The circuit board 10 can only have the circuit board screwing holes 103 penetrating through the circuit board 10, and the circuit board 10 can be provided without other holes penetrating through the circuit board 10.

Referring to FIG. 3, FIG. 4, and FIG. 6, the first fixing member 111 and the pressing structures 113 can be integrally formed. Each of the pressing structures 113 can have a plurality of thru-holes 1131 formed thereon. When the first fixing member 111 is fixed onto the first board surface 101 of the circuit board 10, the pressing structures 113 correspondingly press on parts of the socket bodies 21 of the electrical connection sockets 2, and a part of each of the electrical connection sockets 2 is correspondingly exposed from the corresponding one of the thru-holes 1131. In other words, the first fixing member 111 can hold the circuit board 10 in cooperation with the second fixing member 112, and the first fixing member 111 can enable the electrical connection sockets 2 disposed on the first board surface 101 of the circuit board 10 to be fixed onto the first board surface 101 of the circuit board 10. In a practical application, each of the pressing structures 113 can include a plurality of screwing holes 1132, and each of the pressing structures 113 can be detachably fixed onto the first fixing member 111 through the screwing holes 1132 in cooperation with a plurality of screws.

More specifically, the first fixing member 111 can include a plurality of group accommodating holes 1112, and each of the group accommodating holes 1112 penetrates through the first fixing member 111. Each of the group accommodating holes 1112 is configured to accommodate the electrical connection sockets 2. The first fixing member 111 can further include a plurality of auxiliary fixing portions 1113. Each of the auxiliary fixing portions 1113 is defined by a side wall of each of the group accommodating holes 1112 extending toward a central region of the corresponding one of the group accommodating holes 1112. When the first fixing member 111 is fixed to the circuit board 10, a height of each of the auxiliary fixing portions 1113 corresponding to the circuit board 10 is less than a depth of each of the group accommodating holes 1112.

Each of the pressing structures 113 and each of the auxiliary fixing portions 1113 respectively have a plurality of corresponding screwing holes 1132, 11131, and each of the pressing structures 113 can be screwed on the auxiliary fixing portions 1113 of the corresponding one of the group accommodating holes 1112 through a plurality of screwing members (not shown, such as screws). When the pressing structures 113 and the auxiliary fixing portions 1113 are screwed with each other, the pressing structures 113 correspondingly press on a plurality of abutting portions 213 (as shown in FIG. 6 and is described below) of the socket bodies 21 of the electrical connection sockets 2 in the group accommodating holes 1112, and parts of the electrical connection sockets 2 are correspondingly exposed from the thru-holes 1131 on the pressing structures 113.

Figure 10:
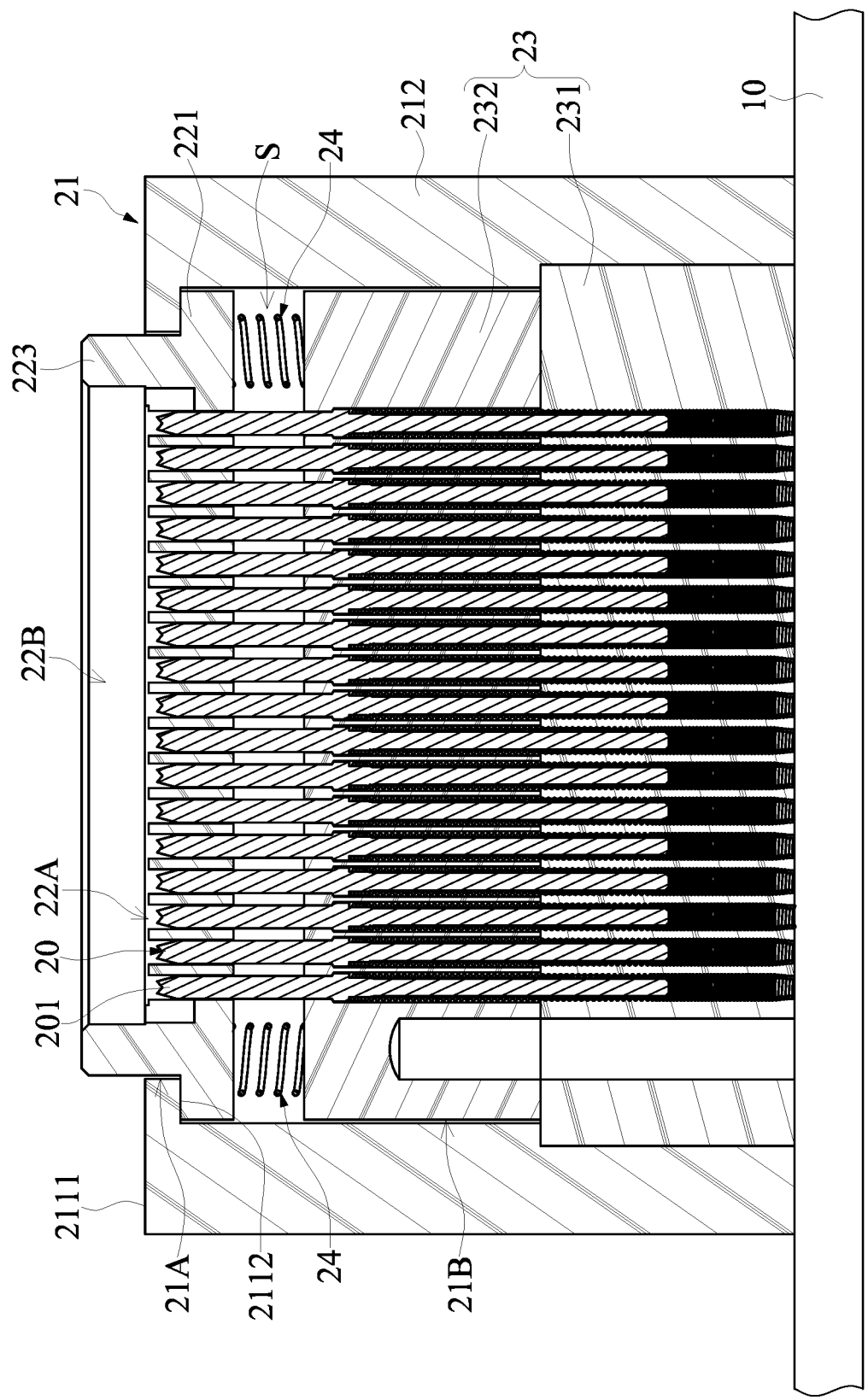
FIG. 10 is a sectional view of the electrical connection socket without a chip disposed thereon of the chip testing device of the present disclosure.

Referring to FIG. 6, the circuit board 10 can have a plurality of groups of electrical contacting structures 1011 formed on the first board surface 101 of the circuit board 10, and each of the groups of electrical contacting structures 1011 can include a plurality of contacting pads (e.g., metal pads). When each of the electrical connection sockets 2 is pressed by the pressing structure 113 to be fixed onto the first board surface 101 of the circuit board 10, one end of a plurality of probe assemblies 20 (as shown in FIG. 10 and described below) correspondingly abuts against one of the groups of the electrical contacting structures 1011. Therefore, when the chip testing apparatus 1 is provided with electricity, the probe assemblies 20 of the electrical connection sockets 2 can be electrically connected to an electrical component disposed on the circuit board 10 through the electrical contacting structures 1011. In a practical application, a plurality of positioning members can be disposed between each of the electrical connection sockets 2 and the circuit board 10, and each of the positioning members can help each of the electrical connection sockets 2 to be disposed on a correct position on the circuit board 10.

According to the above, since the first fixing member 111 is screwed on the first board surface 101 of the circuit board 10 through the screwing members, and the pressing structures 113 of the first fixing member 111 correspondingly press on a part of each of the electrical connection sockets 2, each of the electrical connection sockets 2 can be fixed onto the circuit board 10 by the first fixing member 111 in a pressing manner without screws. Therefore, the quantity of thru-holes of the circuit board 10 can be effectively decreased.

Referring to FIG. 7 and FIG. 8, the control set 3 is disposed on the second board surface 102 of the circuit board 10. The control set 3 includes the testing modules 30, and each of the testing modules 30 is fixed onto the second board surface 102 of the circuit board 10. The second board surface 102 of the circuit board 10 can include a plurality of first contacting structures 1021, and the second fixing member 112 includes a plurality of avoidance holes 1122. When the second fixing member 112 is fixed onto the second board surface 102 of the circuit board 10, the first contacting structures 1021 are correspondingly exposed from the avoidance holes 1122.

Each of the testing modules 30 can include a testing module body 31 and two second contacting structures 32, an electrical component for testing the chips C disposed on the electrical connection sockets 2 is disposed inside of the testing module body 31, the second contacting structures 32 are exposed from one side of the testing module body 31, and the second contacting structures 32 of each of the testing module bodies 31 are configured to be in contact with the first contacting structures 1021 of the circuit board 10. When each of the testing modules 30 is fixed onto the second board surface 102 of the circuit board 10, the contacting structures 32 of each of the testing modules 30 correspondingly penetrate through the avoidance holes 1122 and are in contact with first contacting structures 1021 of the circuit board 10.

When the second contacting structures 32 of each of the testing modules 30 are in contact with the first contacting structures 1021 of the circuit board 10, and the chip testing device 1 is provided with electricity, the testing modules 30 can perform the predetermined testing process to the chips C carried by the electrical connection sockets 2 through the circuit board 10 and the electrical connection sockets 2. In a practical application, the first contacting structures 1021 and the second contacting structures 32 can be board-to-board connectors having pogo pins or reeds, but the present disclosure is not limited thereto. In an embodiment of the present disclosure, each of the testing modules 30 is configured to test a memory chip, the testing module body 31 of each of the testing modules 30 can include a pattern generator (PG), a parametric measurement unit (PMU), a device power supply (DPS), and a driver.

Through the design of the first contacting structures 1021 and the second contacting structures 32, each of the testing modules 30 can be detachably fixed onto the second board surface 102 of the circuit board 10. Since each of the testing modules 30 is detachably fixed onto the second board surface 102 of the circuit board 10, each of the testing modules 30 can be changed according to practical requirements by users, and the particular testing modules 30 can be easily detached or maintained by related maintenance staff. In addition, the control set 3 can include a chassis 33 configured to protect the testing modules 30.

Referring to FIG. 7, in a practical application, the testing module body 31 can include two auxiliary fixing structures 311, each of the auxiliary fixing structures 311 can include a plurality of fixing holes 3111, and the second fixing member 112 can correspondingly include a plurality of fixing holes 1123. Each of the testing module bodies 31 can enable the testing modules 30 to be detachably fixed to the second fixing member 112 through a plurality of screwing members (e.g., screws) in cooperation with the fixing holes 3111 and the fixing holes 1123.

Figure 11:
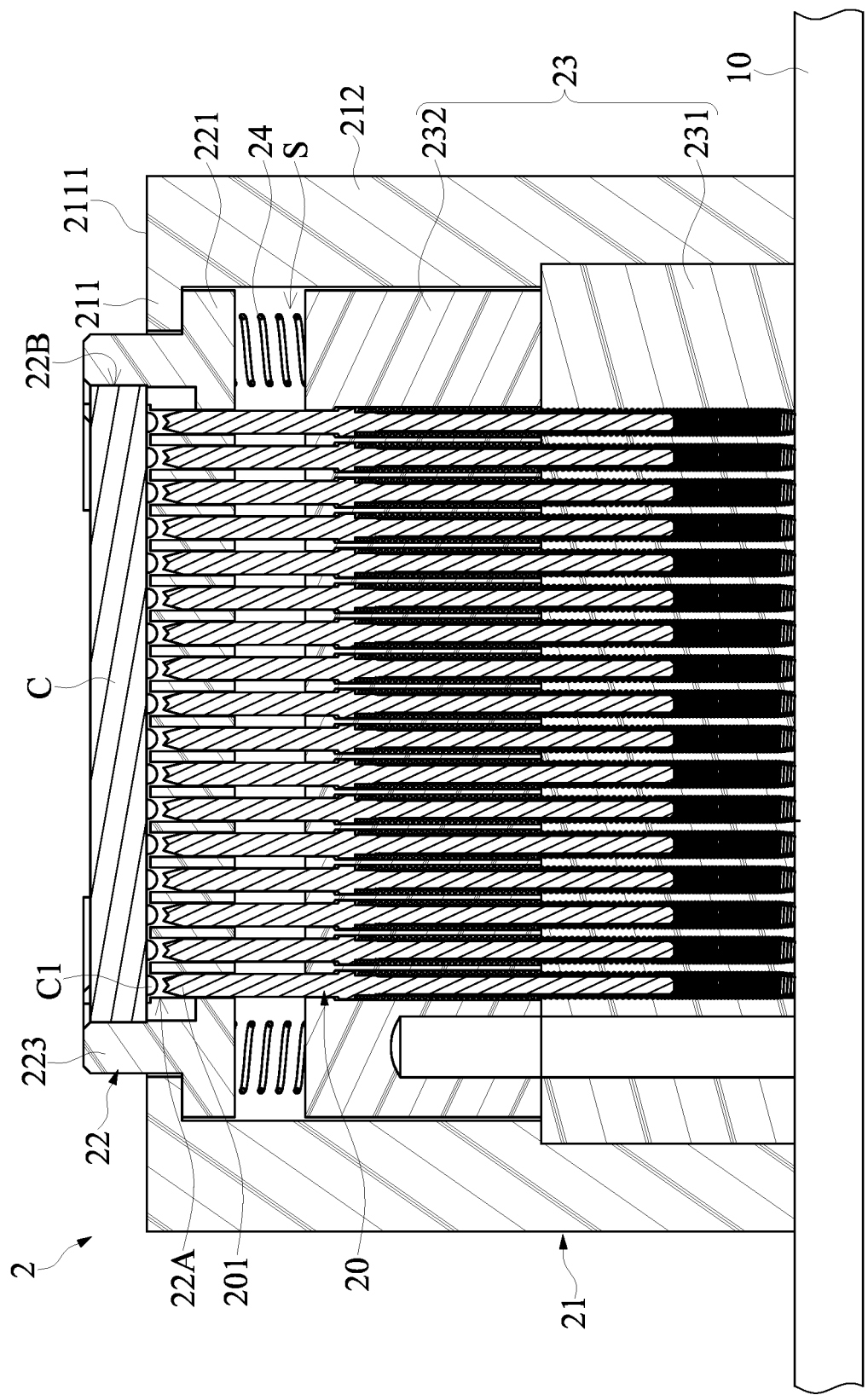
FIG. 11 is a sectional view of the electrical connection socket with a chip disposed thereon of the chip testing device of the present disclosure.
Figure 12:
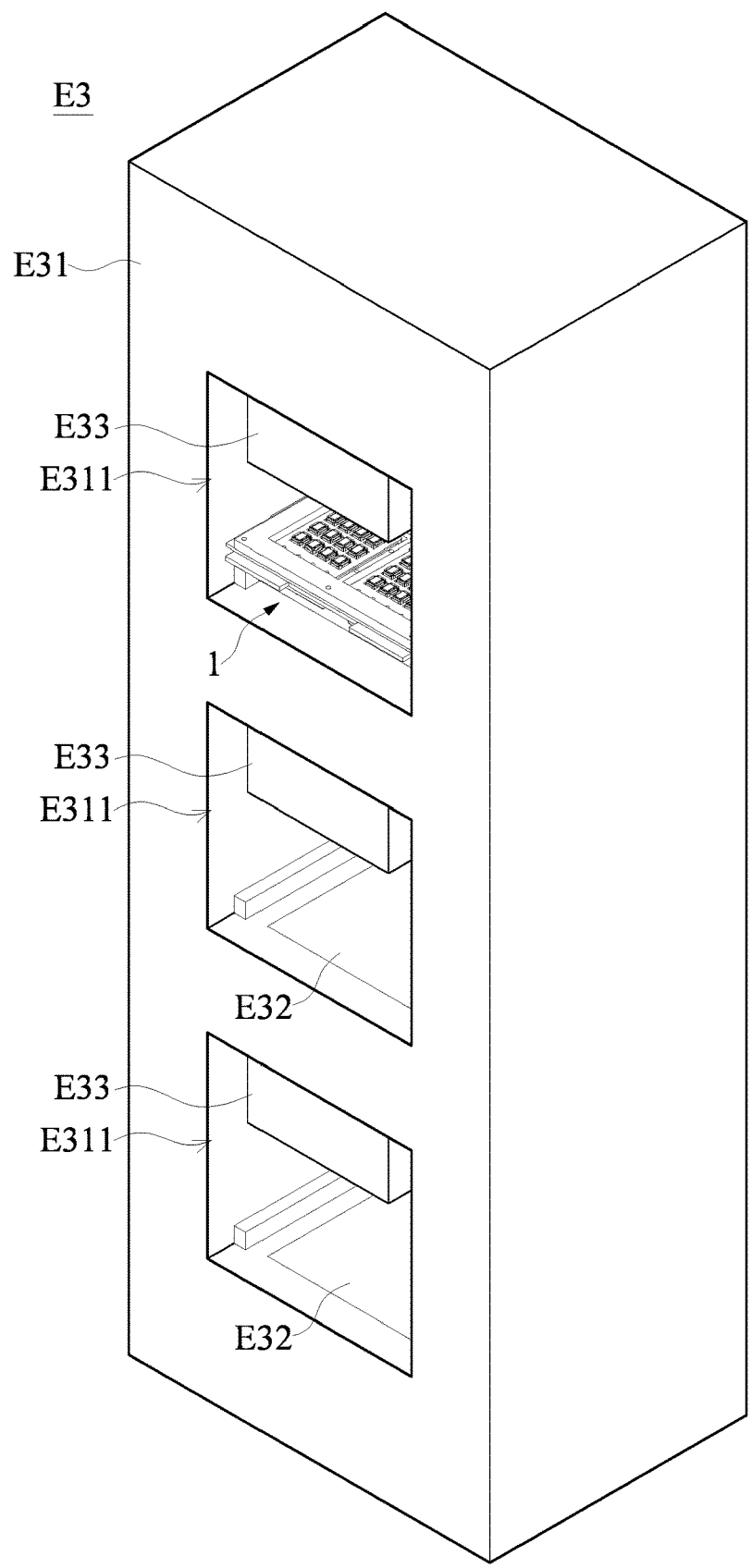
FIG. 12 is a sectional view of the chip testing device of the present disclosure.

Referring to FIG. 8 to FIG. 11, FIG. 9 is a sectional exploded view of an electrical connection socket of the chip testing device of the present disclosure, FIG. 10 is a sectional view of the electrical connection socket without a chip disposed thereon of the chip testing device of the present disclosure, FIG. 11 is a sectional view of the electrical connection socket with a chip disposed thereon of the chip testing device of the present disclosure, and FIG. 12 is a sectional view of the chip testing device of the present disclosure. Each of the electrical connection sockets 2 includes the probe assemblies 20, a socket body 21, a lift structure 22, a supporting structure 23, and a plurality of elastic assemblies 24. Each of the probe assemblies 20 includes a pin 201 and a spring 202. One end of the pin 201 is configured to be connected to one of a plurality of electrical connection portions C1 (as shown in FIG. 11) of the chip C. The spring 202 is sleeved around the pin 201, and when an end of the pin 201 is pressed, the spring 202 is pressed and correspondingly generates an elastic returning force. Accordingly, when the pin 201 is no longer pressed, the spring 202 releases the elastic returning force to return the pin 201 to an initial position.

The socket body 21 has a top wall 211, an annular wall 212, and an abutting portion 213. The top wall 211 has an opening 21A. One end of the annular wall 212 is connected to a peripheral edge of the top wall 211, and the other end of the annular wall 212 is disposed and fixed on the circuit board 10. The top wall 211, the annular wall 212, and the circuit board 10 jointly define an accommodating slot 21B. The top wall 211 has an outer surface 2111 and an inner surface 2112 (as shown in FIG. 11) opposite to the outer surface 2111. In a practical application, the top wall 211 and the annular wall 212 can be integrally formed as a one-piece structure.

As shown in FIG. 3, FIG. 6 and FIG. 8, the abutting portion 213 extends from the annular wall 212. When the pressing structures 113 are fixed to the first fixing member 111, and the first fixing member 111 is fixed to the circuit board 10, the pressing structures 113 abut against the abutting portion 213 of each of the electrical connection sockets 2. That is to say, with each of the abutting portions 213, the pressing structures 113 can be preferably abutted, and the structures of the abutting portions 213 can be designed according to the pressing structures 113 and the thru-holes 1131.

Referring to FIG. 8 to FIG. 11, the lift structure 22 includes a base portion 221 and a carrying portion 222. The base portion 221 is entirely arranged in the accommodating slot 21B. The carrying portion 222 is formed by extending toward one side from the base portion 221, and is partially arranged in the opening 21A. The lift structure 22 includes four retaining portions 223 extending from the carrying portion 222 along a direction away from the base portion 221. The four retaining portions 223 can be respectively formed on four corners of the carrying portion 222. The four retaining portions 223 and the carrying portion 222 jointly form a chip receiving slot 22B for accommodating one of the chips C. The four retaining portions 223 are configured to engage with the chip C. The lift structure 22 further has a plurality of connection holes 22A (as shown in FIG. 11) penetratingly formed through the base portion 221 and the carrying portion 222.

The probe assemblies 20 are partially fixed in the supporting structure 23, and first ends of the probe assemblies 20 are fixed to the supporting structure 23 so as to be connected to the electrical contacting structures 1011 (as shown in FIG. 6) of the circuit board 10. Second ends of the probe assemblies 20 are in one of the connection holes 22A so as to be connected to the electrical connection portions C1 of the chip C.

In a practical application, the supporting structure 23 can include a seat structure 231 and an auxiliary structure 232. The seat structure 231 is arranged in the accommodating slot 21B, and is fixed to the socket body 21 (e.g., the seat structure 231 and the socket body 21 are fixed to each other by screws). The seat structure 231 has a plurality of thru-holes 2311, and the first ends of the probe assemblies 20 are fixed in the thru-holes 2311 of the seat structure 231. The auxiliary structure 232 is arranged in the accommodating slot 21B and between the seat structure 231 and the top wall 211, and the auxiliary structure 232 and the seat structure 231 are fixed to each other (e.g., by screws). The auxiliary structure 232 has a plurality of supporting holes 2321 spaced apart from each other. The supporting holes 2321 are respectively in spatial communication with the thru-holes 2311 of the seat structure 231, and respectively correspond in position to the connection holes 22A. The connection holes 22A, the supporting holes 2321, and the thru-holes 2311 jointly define a plurality of probe channels, and the probe assemblies 20 are respectively arranged in the probe channels.

Figure 9:
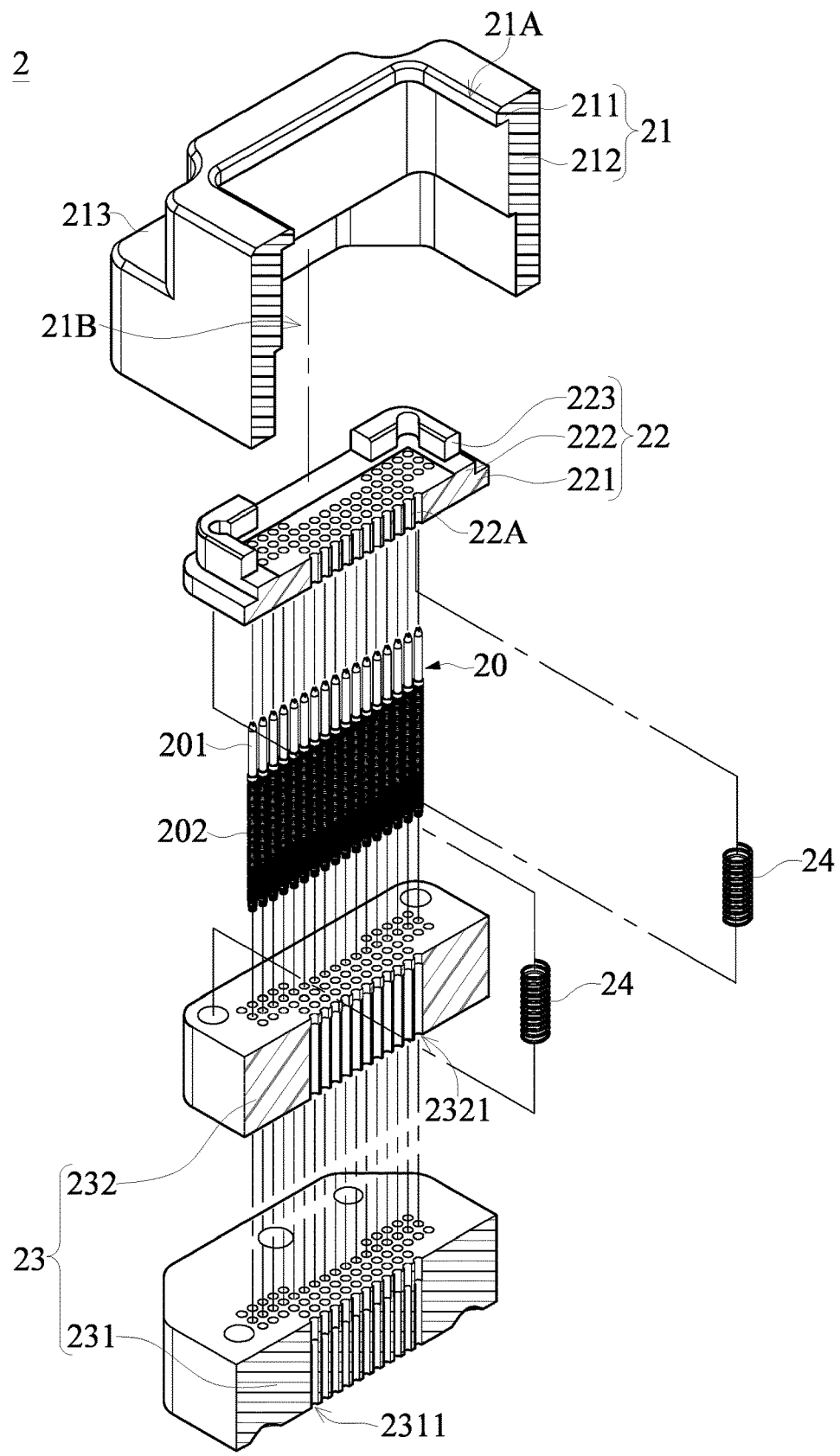
FIG. 9 is a sectional exploded view of an electrical connection socket of the chip testing device of the present disclosure.

Referring to FIG. 9 and FIG. 10, the supporting structure 23 is disposed in the accommodating slot 21B, and the elastic assemblies 24 are disposed between the supporting structure 23 and the lift structure 22. The elastic assemblies 24 are configured to enable the base portion 221 of the lift structure 22 to abut against the inner surface 2112 of the top wall 211 so that the base portion 221 and the lift structure 22 define a gap S there-between. In a practical application, when one of the electrical connection sockets 2 is disposed on the circuit board 10 and the retaining portions 223 of the electrical connection socket 2 are not pressed by an external force, the four elastic assemblies 24 between the lift structure 22 and the supporting structure 23 can be slightly compressed so as to correspondingly generate an elastic returning force, and the elastic returning force enables the lift structure 22 to tightly abut against the inner surface 2112 of the top wall 211.

Referring to FIG. 11, when the chip receiving slot 22B receives the corresponding chip C and the lift structure 22 is not pressed, the electrical connection portions C1 of the chip C are respectively arranged in the connecting holes 22A, and the probe assemblies 20 are not connected to (e.g., not touch) the electrical connection portions C1 of the chip C. When the lift structure 22 is pressed, at least part of the lift structure 22 is moved into the socket body 21. In other words, the lift structure 22 is moved toward the circuit board 10 relative to the supporting structure 23, and the probe assemblies 20 would be correspondingly in contact with the electrical connection portions C1 of the chip C.

Reference is further made to FIG. 3 to FIG. 6, in a practical application, the electrical connection sockets 2 can be divided into a plurality of socket groups, each of the socket groups includes at least one of the electrical connection sockets 2, and each of the testing modules 30 is connected to the at least one electrical connection socket 2 of the corresponding socket group. For example, referring to FIG. 3 and FIG. 4 of the present embodiment, the quantity of the electrical connection sockets 2 disposed onto the circuit board 10 is seventy-two, the seventy-two electrical connection sockets 2 can be divided into six socket groups, and each of the socket groups has twelve of the electrical connection sockets 2. The twelve electrical connection sockets 2 of each of the socket groups are disposed in one of the group accommodating holes 1112, and the twelve electrical connection sockets 2 of each of the socket groups are connected to one of the testing modules 30. In other words, the circuit board 10 shown in FIG. 5 is provided with six testing modules 30. In addition, the quantity of the electrical connection sockets 2 on the circuit board 10 and the quantity of the socket groups can be changed according to practical requirements.

Since the electrical connection sockets 2 on the circuit board 10 are respectively connected to the testing modules 30, a signal transmission between any one of the testing modules 30 and the chips C on the corresponding electrical connection sockets 2 connected to the testing module 30 can be faster and decay is less likely to occur. Specifically, if the circuit board 10 provided with the seventy-two electrical connection sockets 2 is only connected to a single signal input source, and when signal emitted from the signal input source is transmitted from one end of the circuit board 10 to the other end of the circuit board 10, the signal would have a decay issue that may cause an inaccurate test result of chip.

In a practical application, the electrical connection sockets 2 of each of the socket groups can be connected in a parallel connection, and are connected to the same testing module 30. In other words, the electrical connection sockets 2 connected to any one of the testing modules 30 are connected in a parallel connection. In addition, any one of the electrical connection sockets 2 of one of the socket groups is not connected to any one of the electrical connection sockets 2 of another one of the socket groups. For example, four electrical connection sockets 2 (i.e., Z1, Z2, Q1, and Q2) disposed on the circuit board 10 are divided into two socket groups that are respectively defined as a first socket group and a second socket group. The first socket group includes the two electrical connection sockets Z1, Z2 that are connected in a parallel connection, and the second socket group includes the two electrical connection sockets Q1, Q2 that are connected in a parallel connection. Specifically, the electrical connection socket Z1 is not connected to the two electrical connection sockets Q1, Q2, and the electrical connection socket Z2 is not connected to the two electrical connection sockets Q1, Q2.

The electrical connection sockets 2 respectively belonging to different socket groups are not connected to each other. When the chip testing device 1 fails, the socket groups can be can be tested one by one to quickly find a broken electrical connection socket 2, and the chip testing device 1 can be repaired by simply replacing the broken electrical connection socket 2, components of the broken electrical connection socket 2, the socket group having the broken electrical connection socket 2, or the testing module 30 corresponding to the broken electrical connection socket 2. Accordingly, the chip testing device 1 can be repaired without replacing all of the electrical connection sockets 2 and all of the testing modules 30 both on the circuit board 10.

Referring to FIG. 3 and FIG. 4, in a practical application, the quantity of the thru-holes 1131 included by each of the pressing structures 113 can be corresponding to the quantity of the electrical connection sockets 2 in the corresponding one of the group accommodating holes 1112, and when corresponding one of the pressing structures 113 is disposed in the group accommodating hole 1112, a part of each of the electrical connection sockets 2 penetrates from the corresponding one of thru-holes 1131 of the pressing structure 113. Naturally, in other embodiments of the present disclosure, the quantity of the thru-holes 1131 of the pressing structures 113 can be a quantity that does not completely correspond to the quantity of electrical connection sockets 2.

Referring to FIG. 3 to FIG. 6, through the design of the first fixing member 111 and the pressing structures 113, each of the electrical connection sockets 2 is directly fixed to the circuit board 10 in a pressing manner, and each of the socket groups is correspondingly pressed by one of the pressing structures 113. Therefore, when any one of the electrical connection sockets 2 fails, the broken electrical connection socket 2 can be taken off and replaced by the related personnel through removing the screws between the first fixing member 111 and the pressing structure 113 corresponding to the broken electrical connection socket 2. That is to say, through the design of the first fixing member 111 and the pressing structures 113, the particular electrical connection socket 2 can be easily repaired, replaced and mounted by the related personnel or by using the machine.

Figure 13:
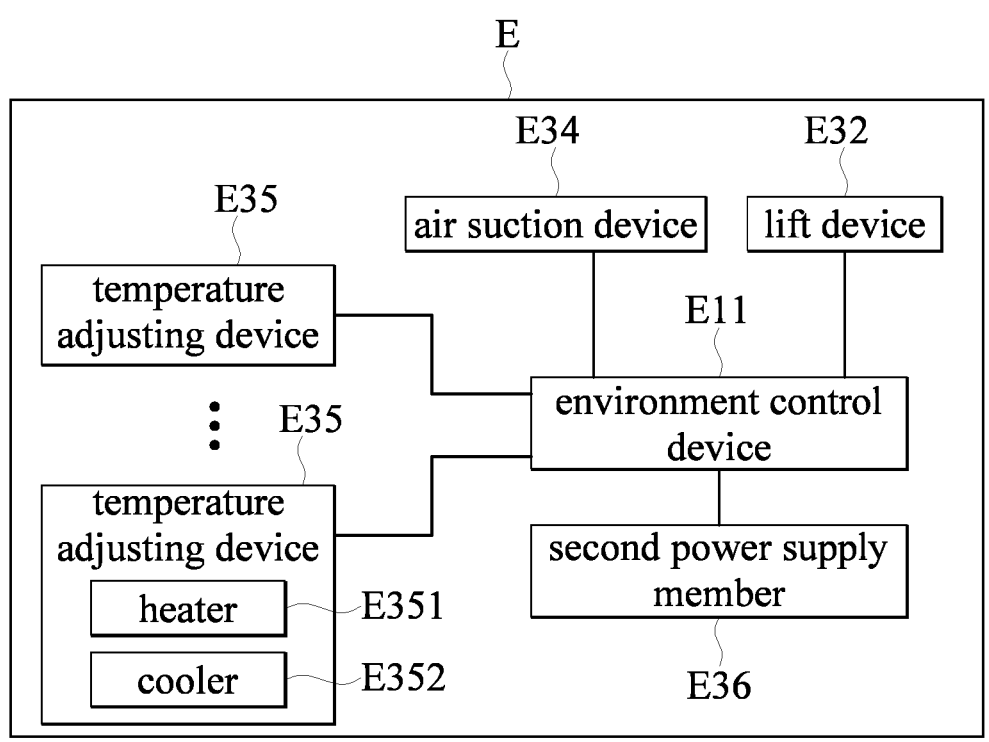
FIG. 13 is a block diagram of an environment control apparatus of the present disclosure.

Referring to FIG. 3 and FIG. 4, the first power supply member 4 included by the chip testing device 1 can be a metal structure formed on the circuit board 10, and the first power supply member 4 can be connected to the testing modules 30 through the circuit board 10. The first power supply member 4 can be a board-to-board connector having pogo pins or reeds, but the present disclosure is not limited thereto. The first power supply member 4 can be connected to a second power supply member E36 (as shown in FIG. 13) of the environment control apparatus E3 (as shown in FIG. 12), and an external power supply apparatus connected to the environment control apparatus E3 can provide electricity to the testing modules 30 through the second power supply member E36, the first power supply member 4, the first contacting structures 1021 and the second contacting structures 32 (as shown in FIG. 5). The external power supply apparatus is independent from the chip testing device 1, and the external power supply apparatus can be any apparatus able to provide electricity, and the present disclosure is not limited thereto. In other words, when the chip testing device 1 is not connected to the external power supply member through the first power supply member 4, the testing modules 30 basically have no electricity to perform the predetermined testing process to the chips C connected to the testing modules 30. Naturally, in other embodiments, the chip testing device 1 can include at least one battery connected to the testing modules 30, and the at least one battery is configured to provide electricity to the testing modules 30.

In a practical application, the first power supply member 4 and the second power supply member E36 can be metal structures formed on the circuit board 10, and when the first power supply member 4 is in contact with the second power supply member E36, the chip testing device 1 is electrically connected to the environment control device E11. The first power supply member 4 and the second power supply member E36 can be a transmitting antenna or a receiving antenna, and electricity can be transmitted between the first power supply member 4 and the second power supply member E36 in a wireless manner.

Referring to FIG. 12 and FIG. 13, FIG. 13 is a block diagram of an environment control apparatus E3 of the present disclosure. Each of the environment control apparatuses E3 includes an apparatus body E31, a plurality of lift devices E32, and a plurality of pressing devices E33. The apparatus body E31 includes a plurality of accommodating chambers E311, and each of the accommodating chambers E311 is primarily configured to accommodate the chip testing device 1. The accommodating chambers E311 included by the apparatus body E3 can be in spatial communication with each other, the accommodating chambers E311 can also be not in spatial communication with each other, and the present disclosure in not limited thereto.

In a practical application, the chip testing system E can include a plurality of environment control apparatuses E3, the central control device E1 can include a plurality of environment control devices E11 (e.g., various types of microprocessors or computers), and the apparatus body E31 of each of the environment control apparatuses E3 can be correspondingly provided with one of the environment control devices E11. In other words, each of the environment control apparatuses E3 can include one of the environment control devices E11. In a practical application, each of the environment control apparatuses E3 can be independently manufactured or sold, and each of the environment control apparatuses E3 can include the environment control devices E11 according to practical requirements.

In an embodiment of the present disclosure, the accommodating chambers E311 of one of the environment control apparatuses E3 are independent from each other and are not in a spatial communication with each other, each of the accommodating chambers E311 can have a movable door, and the environment control apparatus E3 can be connected to an air suction apparatus E34. When the chip testing device 1 is arranged in one of the accommodating chambers E311, the central control device E1 can control the corresponding movable door to move, therefore resulting in the accommodating chamber E311 to be an enclosed space, and the central control device E1 can further control the air suction apparatus E34 to be operated so that the accommodating chamber E311 is in a substantially vacuum state. Accordingly, an inner temperature of the accommodating chamber E311 is not easily affected by an external environment.

The lift devices E32 are disposed in the accommodating chambers E311, and the pressing devices E33 are disposed in the accommodating chambers E311. In other words, each of the accommodating chambers E311 is provided with one of the lift devices E32 and one of the pressing devices E33 disposed therein. In each of the accommodating chambers E311, the pressing device E33 faces toward the lift device E32. Each of the lift structures E32 is connected to the environment control device E11, the environment control device E11 can control each of the lift devices E32 to be independently operated, and the lift device E32 controlled to be operated can move the chip testing device 1 in one of the accommodating chambers E311 toward or away from the pressing device E33.

When the chip testing device 1 carrying the chips C to be tested is disposed in one of the accommodating chambers E311, the environment control device E11 can control the corresponding one of the lift structures E32 to be operated to move the chip testing device 1 toward the pressing device E33 until the pressing device E33 abuts against a plurality of side surfaces of the chips C carried by the chip testing device 1. When the press device E33 abuts against the side surfaces of the chips C carried by the chip testing device 1, the environment control device E11 can control the chip testing device 1 to perform the predetermined testing process to the chips C carried by the chip testing device 1.

In an embodiment of the present disclosure, the chip testing system E includes the environment control apparatuses E3, any one of the environment control apparatuses E3 includes the environment control devices E11 independent from other the environment control apparatuses E3, and each of the environment control apparatuses E3 can independently control the chip testing devices 1 disposed in different accommodating chambers E311 to perform different predetermined testing process to the chips C carried by the chip testing devices 1.

Referring to FIG. 13, in a practical application, each of the environment control apparatuses E3 can further include a plurality of temperature adjusting devices E35. Each of the temperature adjusting devices E35 is electrically connected to the environment control device E11, each of the temperature adjusting devices E35 is connected to the corresponding one of the pressing devices E33, and the environment control device E11 can control each of the temperature adjusting devices E35 to be independently operated so that a temperature of a contacting structure E331 of the pressing device E33 reaches the predetermined low temperature or the predetermined high temperature.

In a practical application, each of the temperature adjusting devices E35 can include a heater E351 and a cooler E352. Both the heater E351 and the cooler E352 are connected to the contacting structure E331, and both the heater E351 and the cooler E352 can be controlled by the environment control device E11 to be independently operated so that the temperature of the contacting structure E331 reaches the predetermined high temperature or the predetermined low temperature. The heater E351 can be various types of heating coils, the cooler E352 can be various types of cooling chips, and the present disclosure is not limited thereto. The temperature adjusting device E35 can include both the heater E351 and the cooler E352 according the practical requirements, but the present disclosure is not limited thereto. In other embodiments, the temperature adjusting device E35 can include only the heater E351 or the cooler E352.

In other embodiments, the temperature adjusting device E35 can also include a fluid channel, and the fluid channel can be provided with a high-temperature fluid or a low-temperature fluid flowing there-through. When the high-temperature fluid or the low-temperature fluid flows through the fluid channel, the temperature of the contacting structure E331 reaches the predetermined high temperature or the predetermined low temperature. In other embodiments, each of the temperature adjusting devices E35 can be not connected to the pressing device E33, and each of the temperature adjusting devices E35 is configured to enable a temperature of the accommodating chamber E311 to directly reach the predetermined high temperature or the predetermined low temperature.

When the chip testing device 1 carries the chips C and is disposed in one of the accommodating chambers E311, the environment control device E11 controls the lift device E32 to be operated to that one side of the chips C abuts against the contacting structure E331 of the pressing device E33. Afterwards, the environment control device E11 can control the temperature adjusting device E35 to be operated so that the temperature of the contacting structure E331 reaches the predetermined high temperature or the predetermined low temperature. Finally, the environment control device E11 controls the chip testing device 1 to be operated so that the chip testing device 1 performs the predetermined testing process to the chips C carried by the chip testing device 1. Therefore, each of the chips C can have the predetermined testing process performed thereon in an environment having the predetermined high temperature or the predetermined low temperature.

It is worth mentioning that in the present embodiment, the apparatus body E31 includes the lift devices E32, and the environment control device E11 can move the chip testing device 1 in one of the accommodating devices E311 and one of the pressing devices E33 toward or away from each other through the corresponding one of the lift devices E32, but the environment control device E11 is not limited to move the chip testing device 1 and the pressing device E33 through the lift device E32. In other embodiments, each of the pressing devices E33 can be connected to a move device, and the environment control device E11 can move the pressing device E33 toward or away from the chip testing device 1 disposed in one of the accommodating chambers E311 through the move device.

Figure 14:
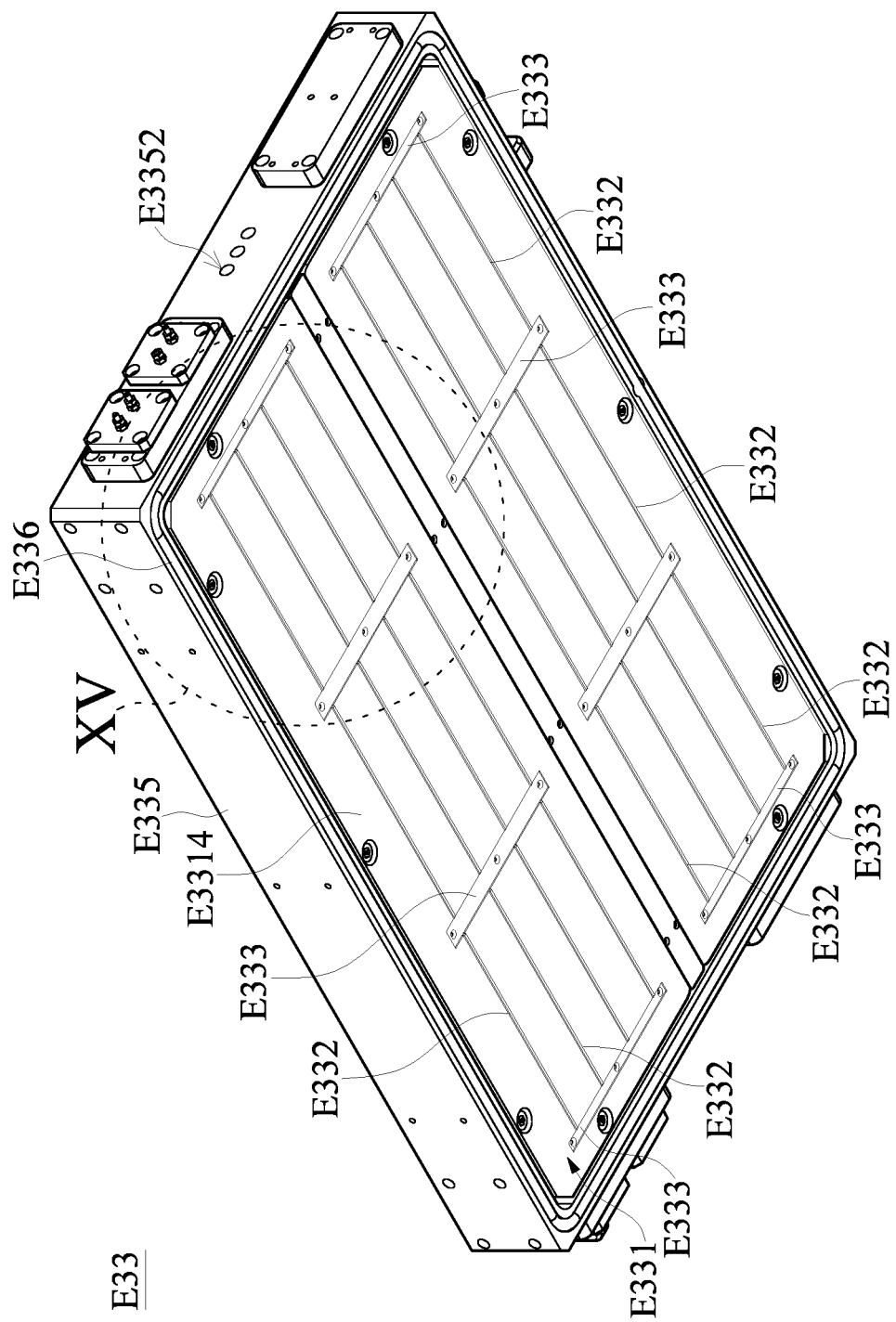
FIG. 14 is a schematic view of a pressing device of the present disclosure.
Figure 15:
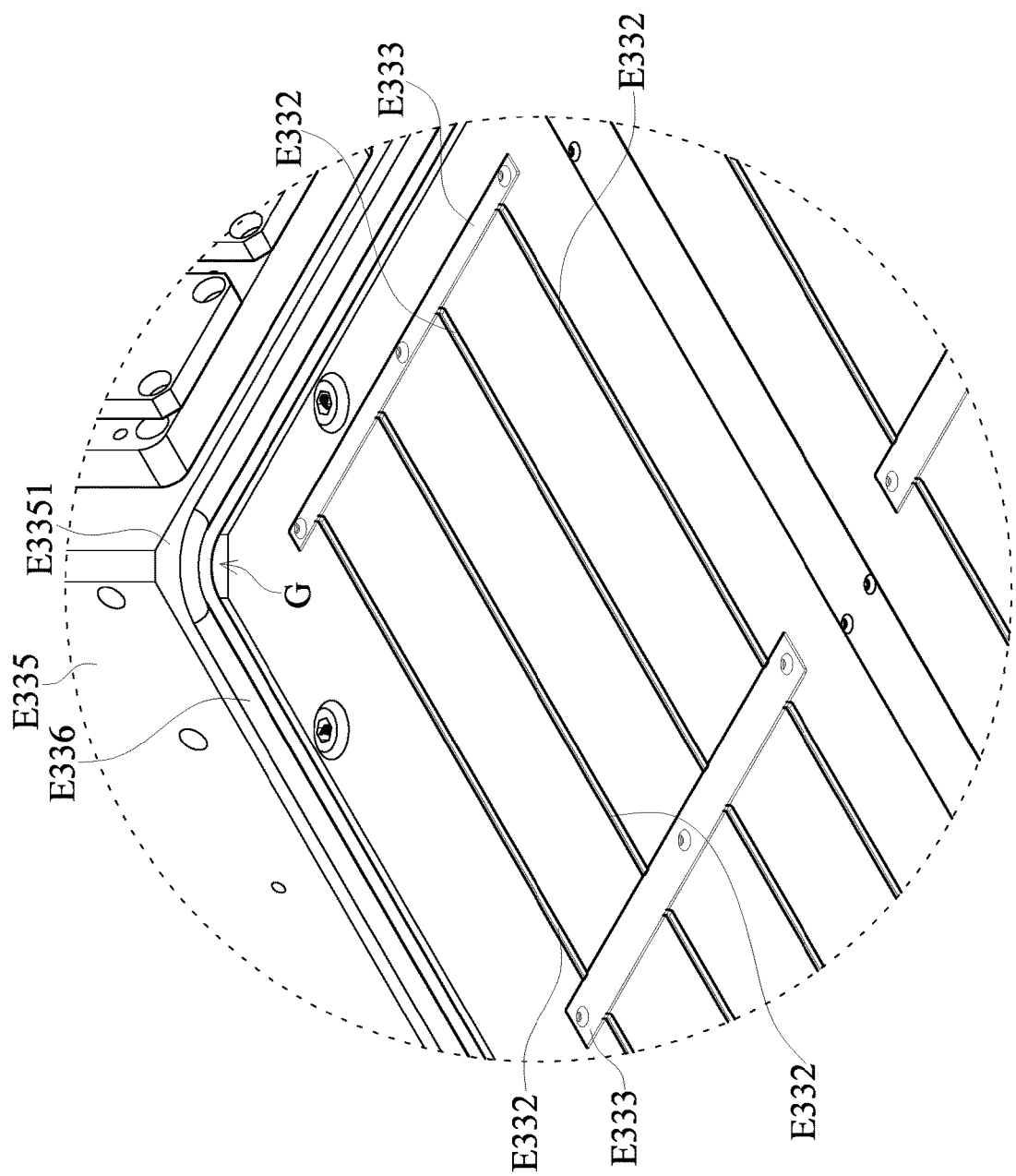
FIG. 15 is a partially enlarged view of FIG. 14.
Figure 16:
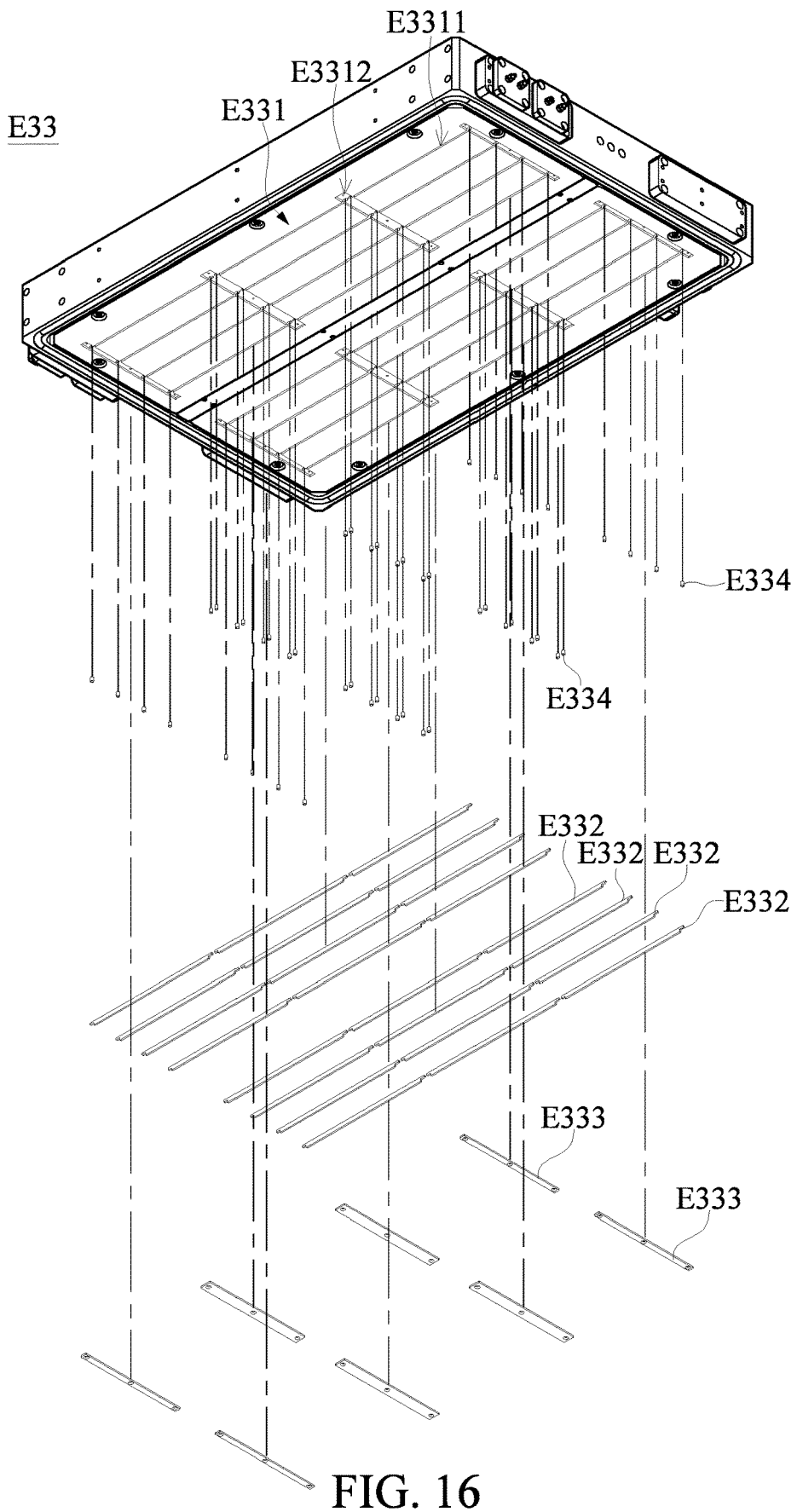
FIG. 16 is an exploded view of the pressing device of the present disclosure.
Figure 17:
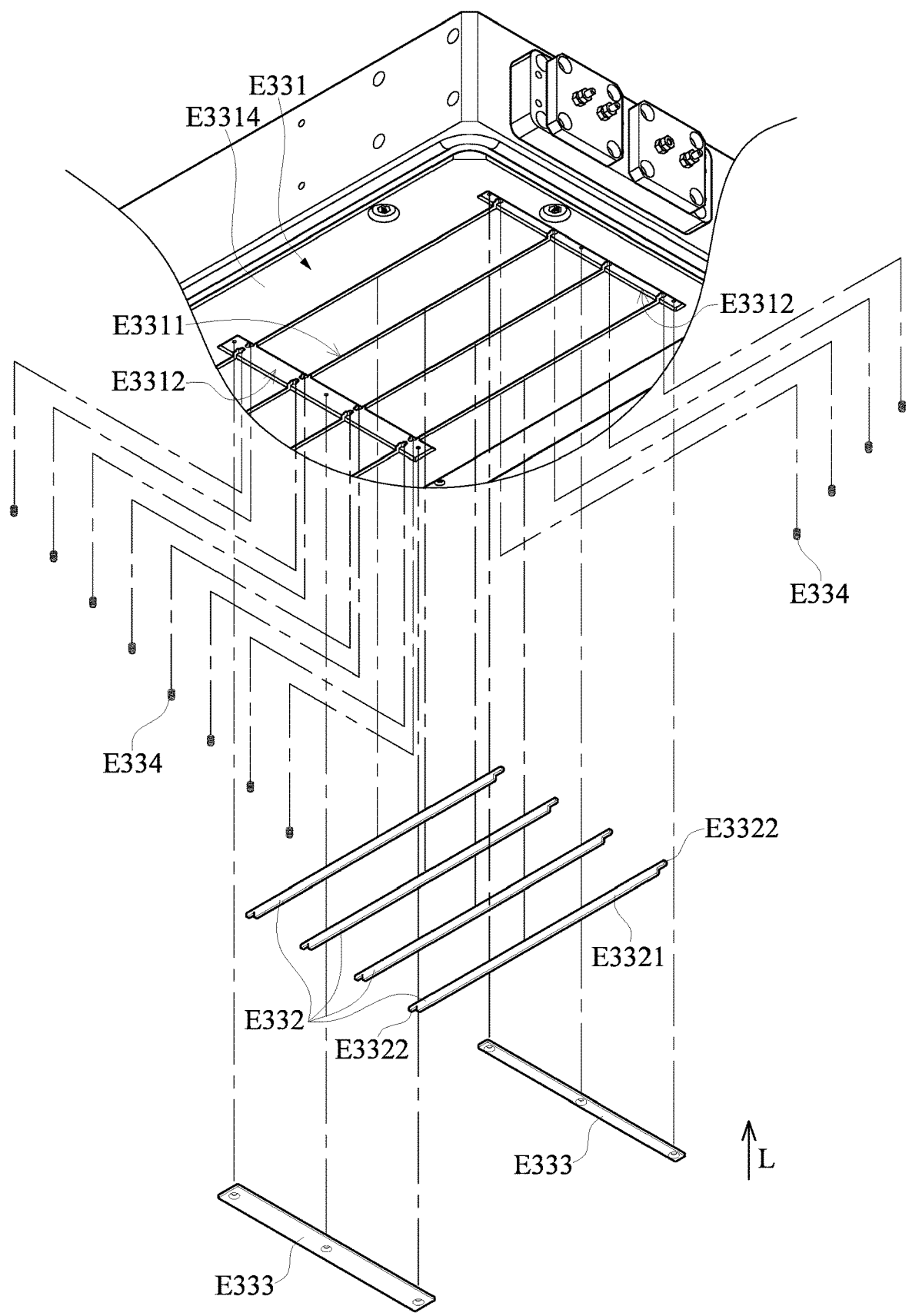
FIG. 17 is a partially enlarged exploded view of the pressing device of the present disclosure.

Referring to FIG. 14 to FIG. 17, FIG. 14 is a schematic view of a pressing device of the present disclosure, FIG. 15 is a partially enlarged view of FIG. 14, FIG. 16 is an exploded view of the pressing device of the present disclosure, and FIG. 17 is a partially enlarged exploded view of the pressing device of the present disclosure. Each of the pressing devices E33 includes the contacting structure E331, a plurality of movable members E332, a plurality of retaining members E333, and a plurality of elastic members E334. In other embodiments, each of the pressing devices E33 can be provided without the elastic members E334.

The contacting structure E331 includes a plurality of move slots E3311, a plurality of retaining slots E3312, and a plurality of spring accommodating slots E3313. Each of the move slots E3311 is formed by a contacting surface E3314 of the contacting structure E331 being recessed along a longitudinal direction L. The contacting structure E331 can be metal cuboid, but the present disclosure is not limited thereto. The structure of the contacting structure E331 can be changed according to practical requirements, and the contacting structure E331 can be made of any thermally conductive materials.

Each of the retaining slots E3312 is formed by the contacting surface E3314 being recessed along the longitudinal direction L, and each of the retaining slots E3312 is simultaneously connected to a plurality of ends of the move slots E3311. More specifically, The move slots E3311 can be disposed side by side along a first direction and be spaced apart with each other, the retaining slots E3312 can be disposed along a second direction perpendicular to the first direction, and two opposite ends of each of the retaining slots E3312 are correspondingly in spatial communication with two retaining slots E3312, but the present disclosure is not limited thereto.

Figure 18:
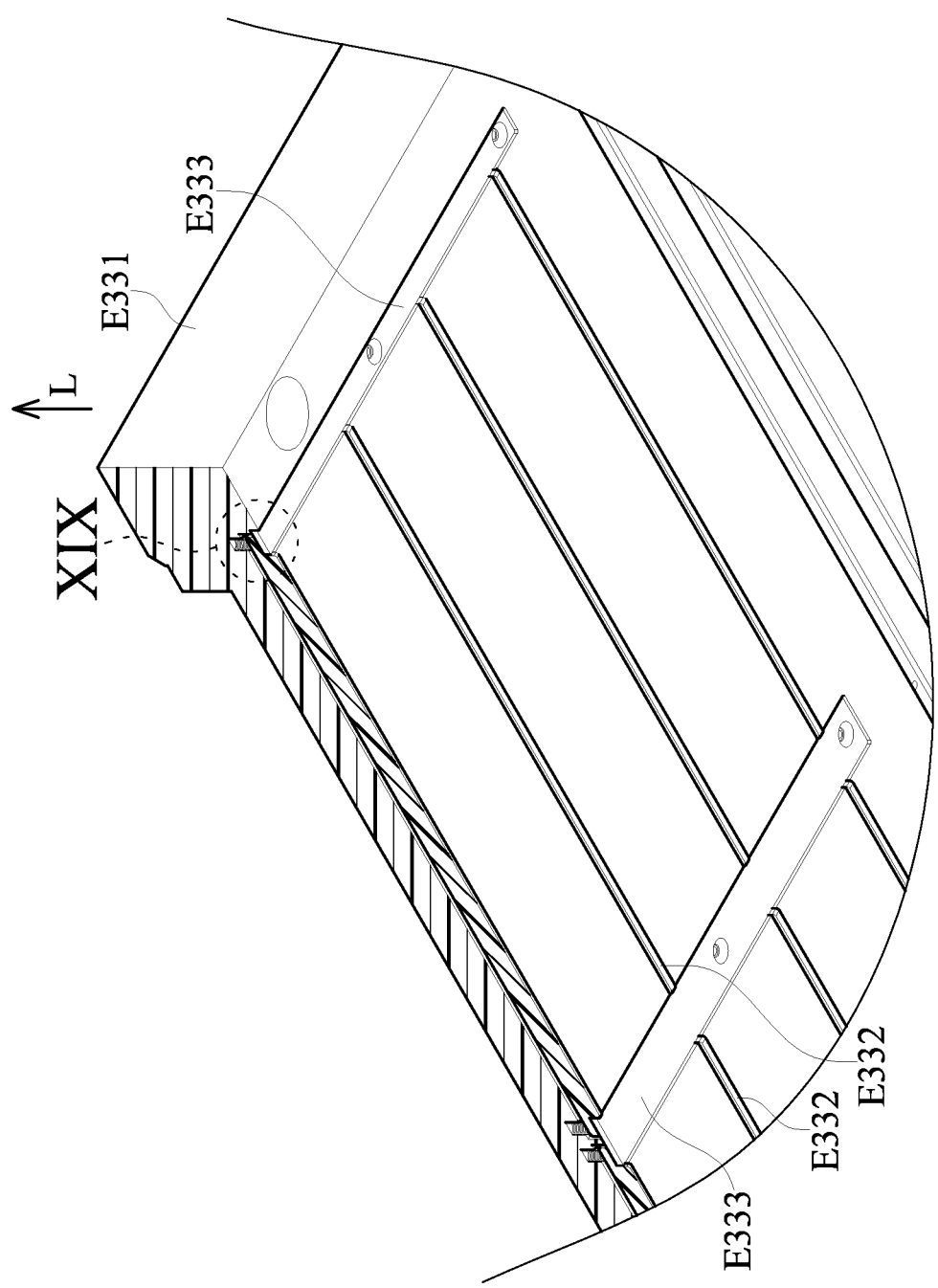
FIG. 18 is a partial sectional view of the pressing device of the present disclosure.
Figure 19:
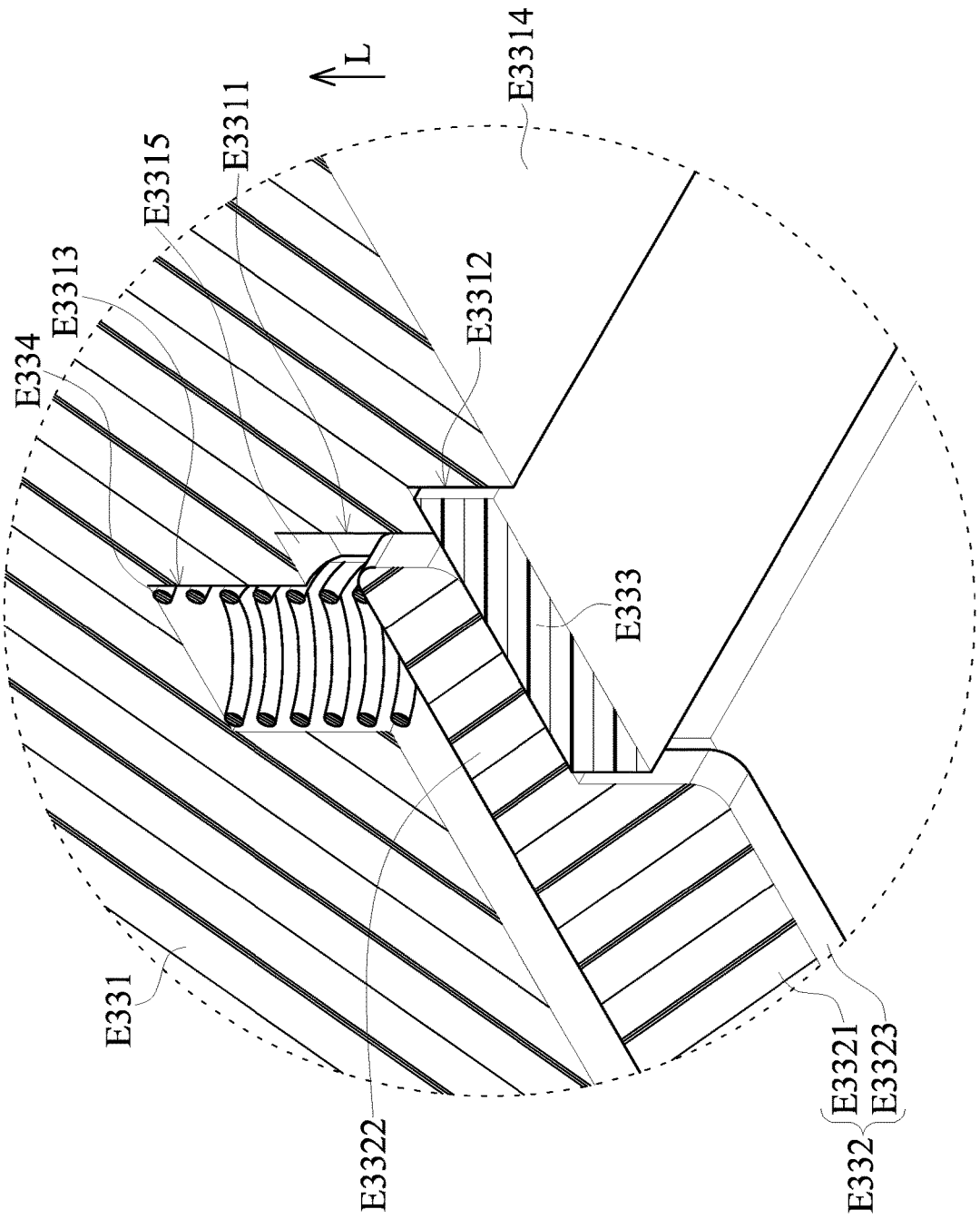
FIG. 19 is a partially enlarged view of FIG. 18.
Figure 20:
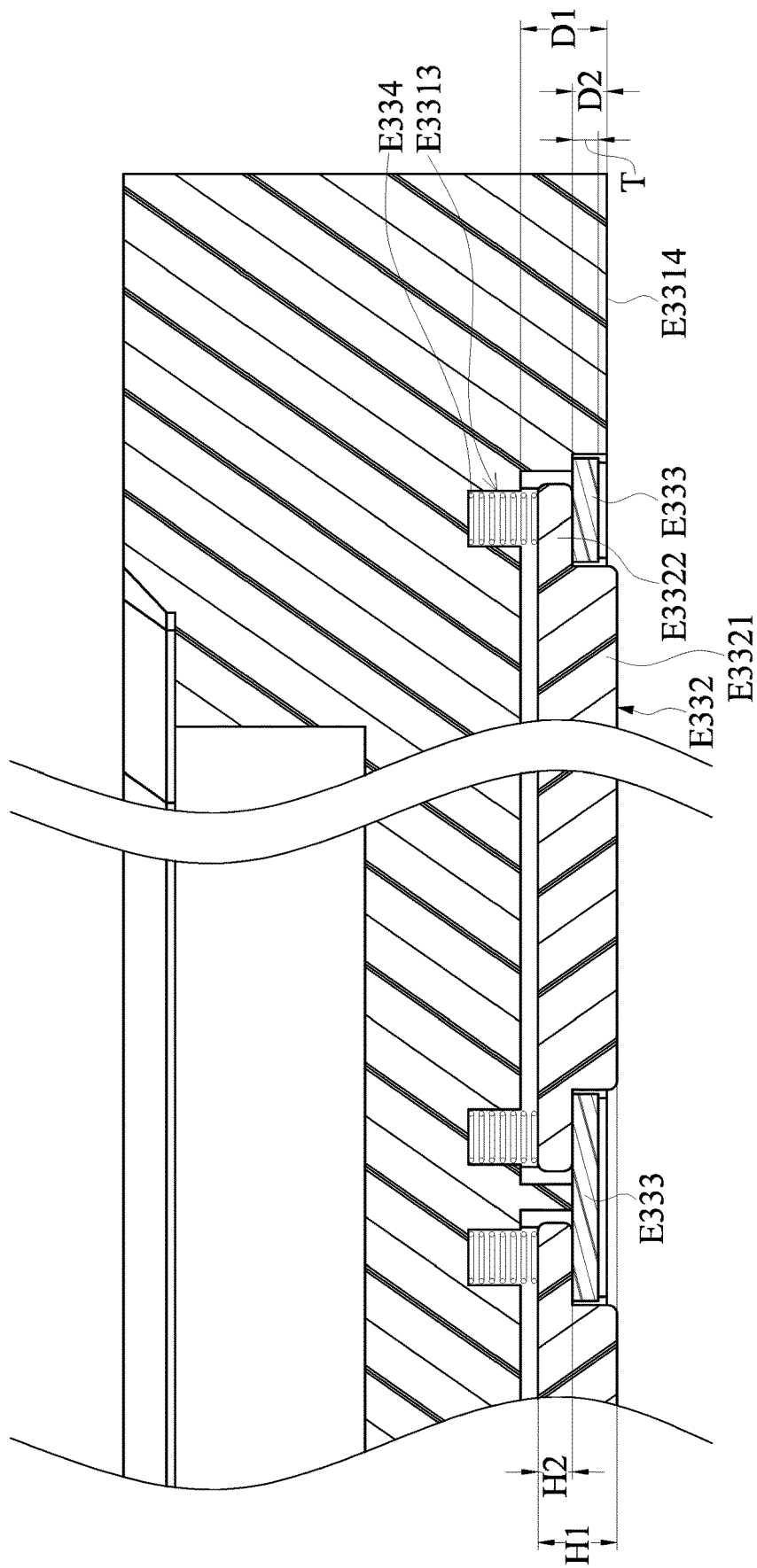
FIG. 20 is partial sectional front view of the pressing device of the present disclosure.
Figure 21:
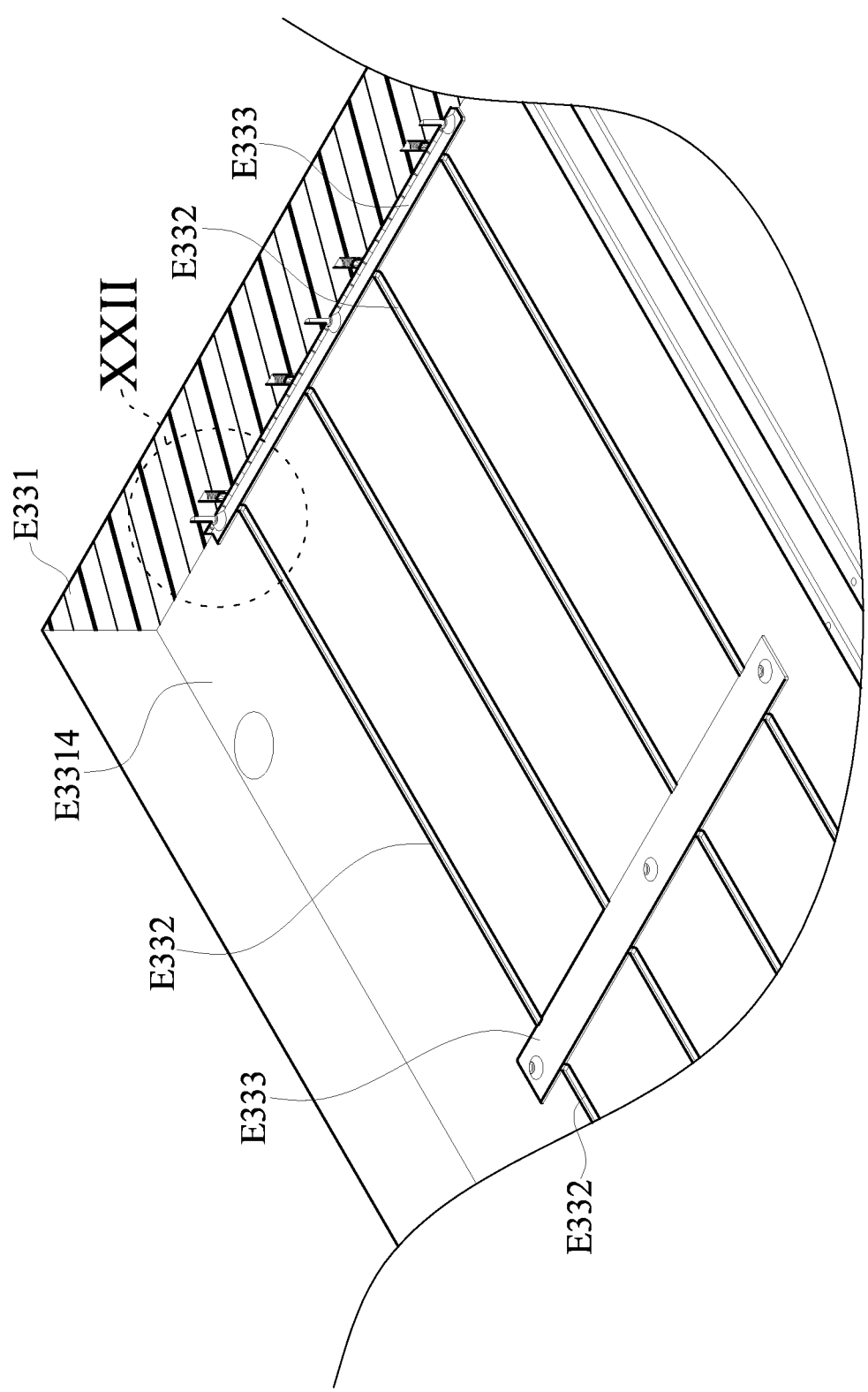
FIG. 21 is a partial sectional view from another angle of the pressing device of the present disclosure.
Figure 22:
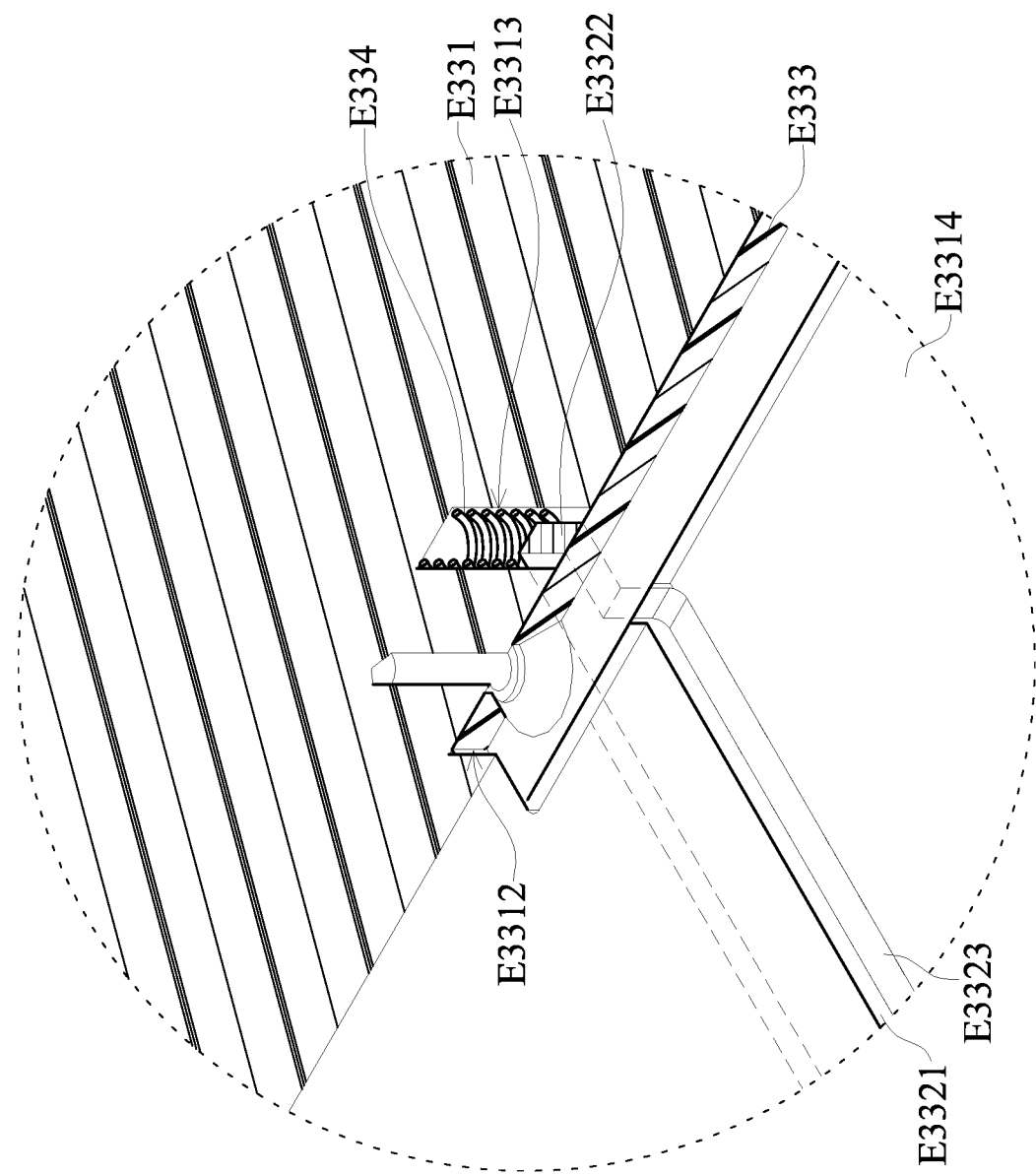
FIG. 22 is a partially enlarged view of FIG. 21.

Referring to FIG. 18 to FIG. 22, FIG. 18 is a partial sectional view of the pressing device of the present disclosure, FIG. 19 is a partially enlarged view of FIG. 18, FIG. 20 is partial sectional front view of the pressing device of the present disclosure, FIG. 21 is a partial sectional view from another angle of the pressing device of the present disclosure, and FIG. 22 is a partially enlarged view of FIG. 21. Each of the movable members E332 is correspondingly disposed in one of the move slots E3311. Each of the movable members E332 can include a pushing portion E3321 and two retaining portions E3322. Two ends of the pushing portion E3321 extend to form the two retaining portions E3322, and the pushing portion E3321 and each of the retaining portions E3322 define a stepped structure at a position where the pushing portion E3321 is connected to each of the retaining portions E3322. A height H1 of the pushing portion E3321 of each of the movable members E332 can be greater than a height H2 of each of the retaining portions E3322, and the pushing portion E3321 and each of the retaining portions E3322 define an L-shaped structure at the position where the pushing portion E3321 is connected to each of the retaining portions E3322. In the present embodiment, each of the movable members E332 is in a sheet structure, but the present disclosure is not limited thereto. In other embodiments, each of the movable members E332 can be in a wire structure. In addition, a material of each of the movable members E332 can be determined according to the predetermined high temperature or the predetermined low temperature, such as metal or engineering plastic.

The pushing portion E3321 of each of the movable members E332 is disposed in the corresponding move slot E3311, the height H1 of the pushing portion E3321 of each of the movable members E332 along the longitudinal direction L is not greater than a depth D1 of each of the move slots E3311, and each of the movable members E332 can move into the corresponding move slot E3311. When each of the movable members E332 moves into the corresponding move slot E3311, a pushing surface E3323 of each of the movable members E332 can be flush with the contacting surface E3314, or the pushing surface E3323 of the movable member E332 can be arranged in the move slot E3311.

Each of the retaining members E333 is fixed to the corresponding retaining slot E3312, and the retaining members E333 are configured to limit a range of movement of the movable members E332 relative to the contacting structure E331. In a practical application, a depth D2 of each of the retaining slots E3312 along the longitudinal direction L is less than the depth D1 of each of the move slots E3311 along the longitudinal direction L, and a thickness T of each of the retaining members E333 is equal to or less than the depth D2 of each of the retaining slots E3312, but the present disclosure is not limited thereto. The structure of each of the retaining members E333 corresponds to the structure of each of the retaining slots E3312, and when each of the retaining members E333 is fixed to the corresponding retaining slot E3312, each of the retaining slots E3312 is fully filled by the retaining member E333. Each of the retaining members E333 can be made of any thermally conductive materials, but the present disclosure is not limited thereto. Each of the retaining members E333 can be detachably fixed to the contacting structure E331 in cooperation with a plurality of screws.

It should be noted that each of the move slots E3311 and the corresponding retaining slots E3312 connected thereto are in spatial communication with each other in the longitudinal direction L. When one of the retaining members E333 is disposed in the corresponding retaining slot E3312, the retaining portions E3322 of the movable member E332 are blocked by the retaining member E333 and would not leave the contacting structure E331 through the retaining slot E3312, but the retaining portions E3322 of the movable member E332 can still move in the move slot E3311. When the pushing surface E3323 of the movable member E332 faces toward the ground, the retaining portions E3322 of the movable member E332 are affected by gravity and abut against the retaining member E333, the pushing portion E3321 is partially exposed from the move slot E3311, and the pushing portion E3321 partially protrudes from the contacting surface E3314.

A bottom wall E3315 of each of the move slots E3311 is recessed along a direction away from the contacting surface E3314 to form the corresponding spring accommodating slot E3313, each of move slots E3311 is in spatial communication with at least two spring accommodating slots E3313, and each of the spring accommodating slots E3313 is configured to accommodate an elastic member E334. An end of each of the elastic members E334 is fixed to the contacting structure E331, and another end of each of the elastic member E334 is connected to the corresponding movable member E332.

In a practical application, when the movable members E332 are retained in the move slots E3311 by the retaining members E333, each of the elastic members E334 can be in a pressed state, an elastic returning force generated by each of the pressed elastic members E334 enables the two retaining portions E3322 of the elastic member E334 to tightly abut against the two retaining members E333, and a part of the pushing portion E3321 of each of the elastic members E334 protrudes from the contacting surface E3314 at any time. In other words, the pushing surface E3323 protrudes from the contacting surface E3314 at any time.

Figure 23:
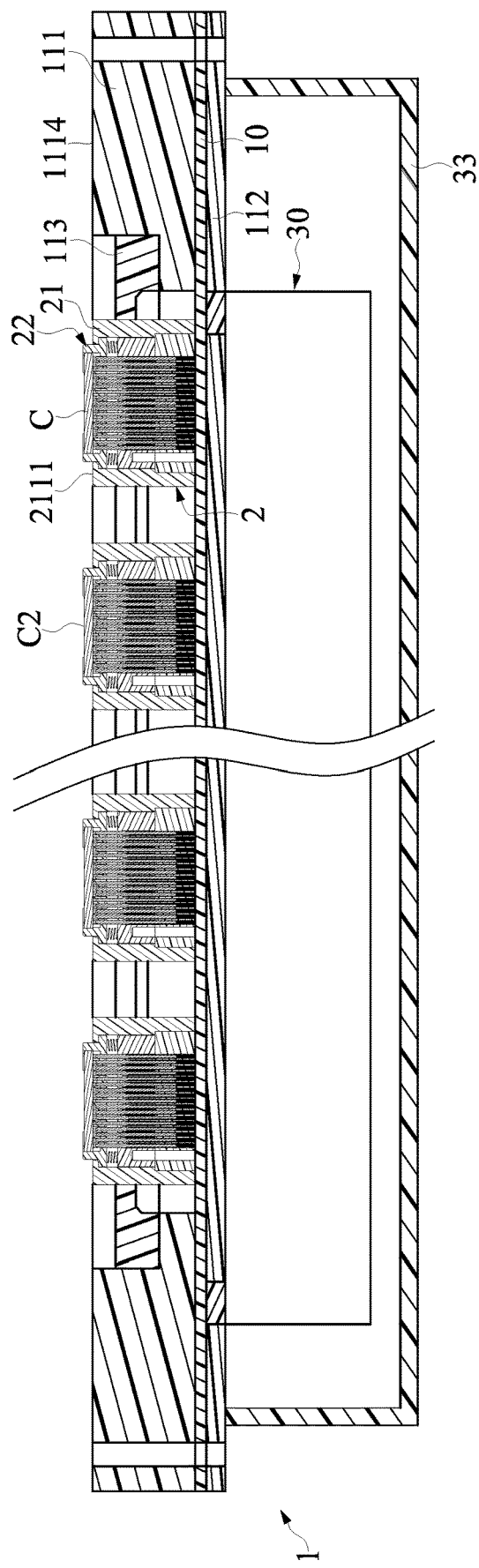
FIG. 23 is a sectional side view of the chip testing device of the present disclosure.
Figure 24:
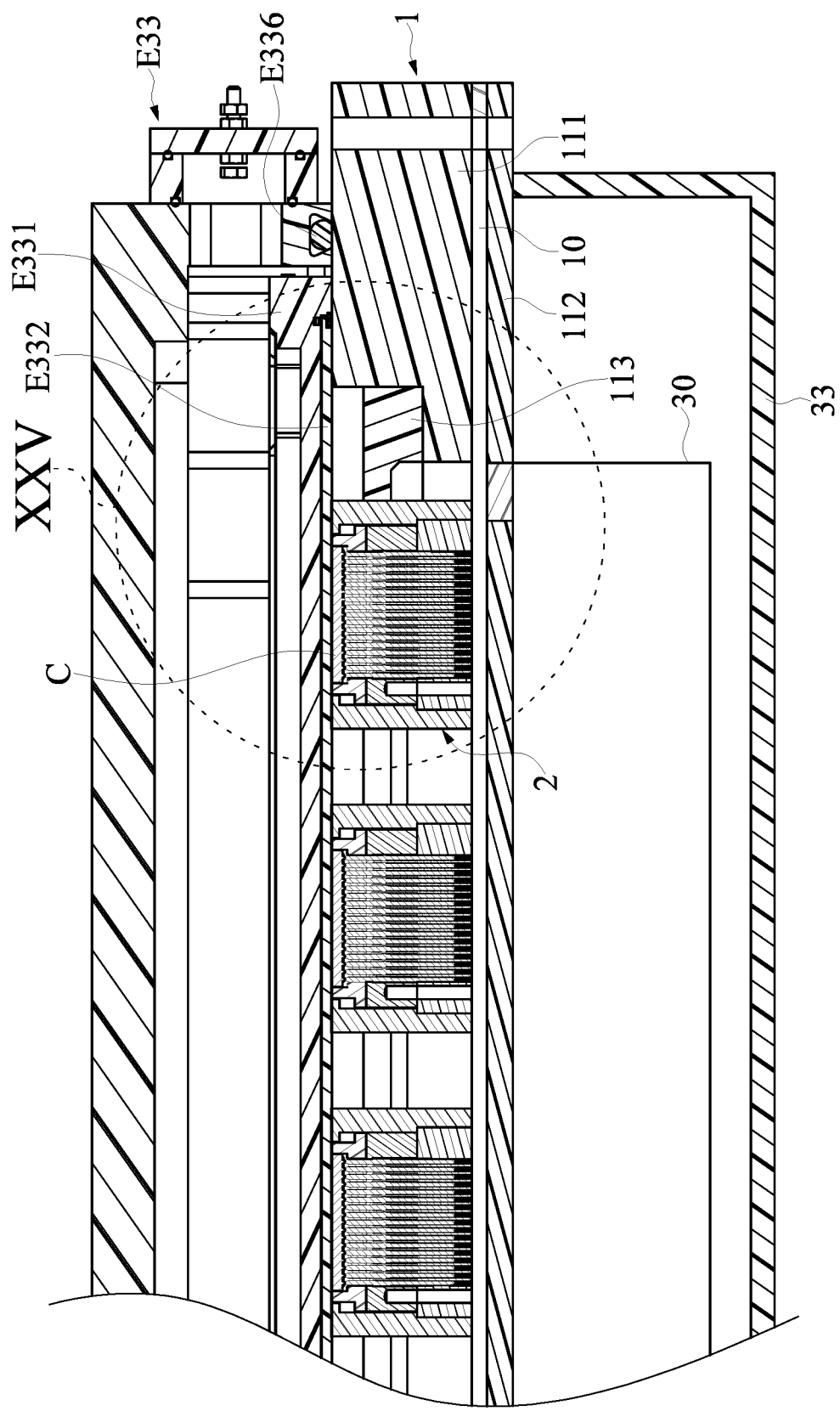
FIG. 24 is a sectional view of the pressing device pressing a plurality of side surfaces of a plurality of chips of the present disclosure.
Figure 25:
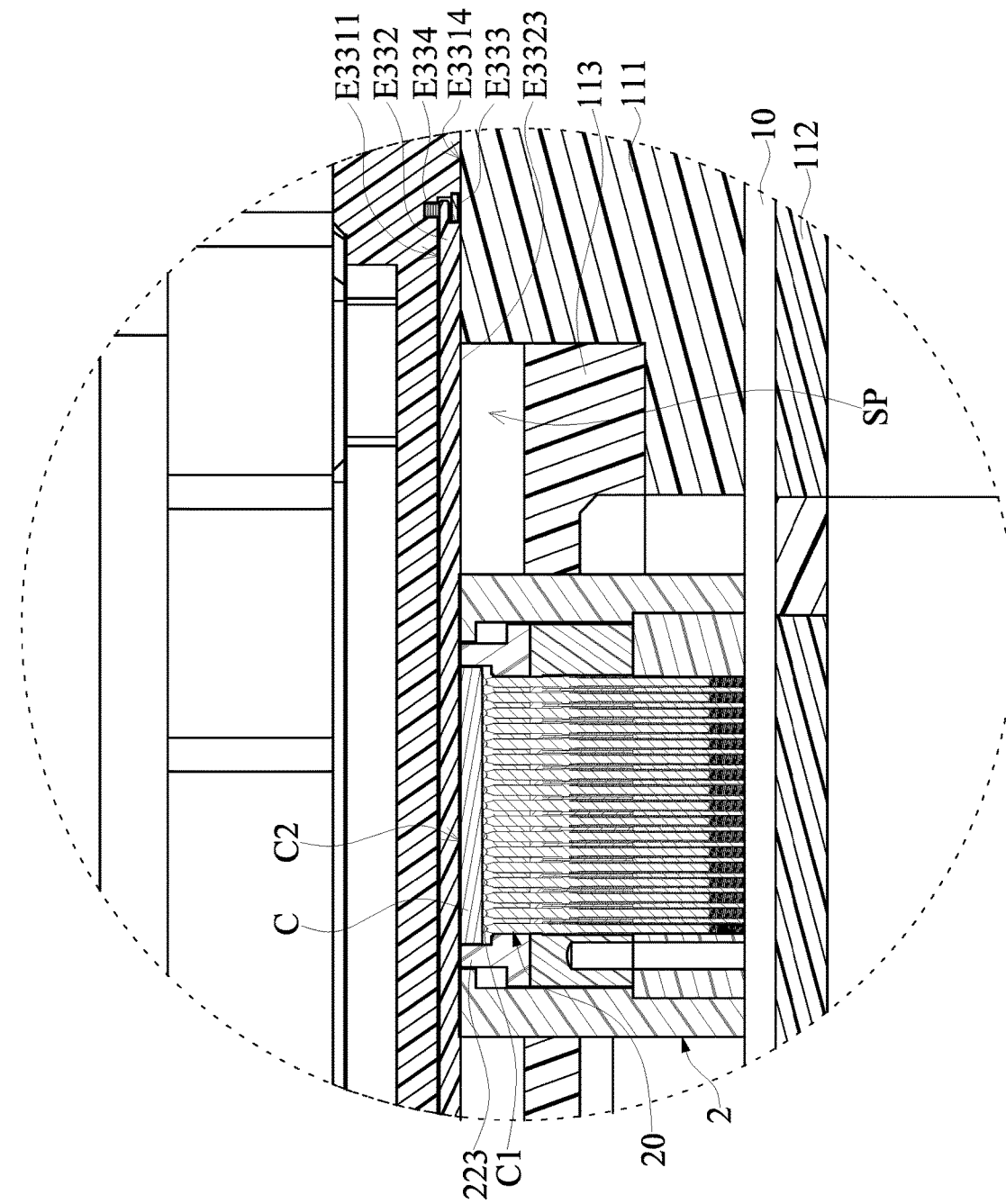
FIG. 25 is a partially enlarged view of FIG. 24.

Referring to FIG. 23 to FIG. 25, FIG. 23 is a sectional side view of the chip testing device of the present disclosure, FIG. 24 is a sectional view of the pressing device pressing a plurality of side surfaces of a plurality of chips of the present disclosure, and FIG. 25 is a partially enlarged view of FIG. 24. As shown in FIG. 23, when the chip testing device 1 is not pressed by the pressing device E33, an abutting surface 1114 of the first fixing member 111 is flush with the outer surface 2111 of each of the socket bodies 21, and a part of the lift structure 22 of each of the electrical connection sockets 2 is higher than the abutting surface 1114. In other words, when the chips C are disposed on the electrical connection sockets 2 and the chip testing device 1 is not pressed by the pressing device E33, a part of the lift structure 22 can be higher than the abutting surface 1114. The chips C disposed in the lift structure 22 can be higher than the abutting surface 1114 or not higher than the abutting surface 1114, and the present disclosure is not limited thereto.

Referring to FIG. 24 and FIG. 25, when the environment control device E11 controls the lift device E32 to be operated and the contacting surface E3314 of the pressing device E33 and the pushing surface E3323 of the movable member E332 are simultaneously in contact with the side surfaces of the chips C carried by the chip testing device 1, the elastic members E334 are pressed again, and each of the elastic members E334 generates a greater elastic returning force.

When the contacting surface E3314 of the pressing device E33 and the pushing surface E3323 of the movable member E332 are simultaneously in contact with the side surfaces of the chips C carried by the chip testing device 1, the environment control device E11 can control the temperature adjusting device E35 to be operated so that the temperature of the contacting structure E331 reaches the predetermined high temperature or the predetermined low temperature, and the environment control device E11 controls the chip testing device 1 to perform the predetermined testing process to the chips C carried by the chip testing device 1.

Referring to FIG. 14 and FIG. 15, in a practical application, the pressing device E33 can further include a frame body E335 and an elastic annular enclosed member E336. The frame body E335 surrounds the contacting structure E331, the contacting surface E3314 of the contacting structure E331 can be flush with an annular abutting surface E3351 of the frame body E335, and the annular abutting surface E3351 is correspondingly provided with the elastic annular enclosed member E336. In other embodiments, the contacting surface E3314 can be higher than the annular abutting surface E3351, but the contacting surface E3314 is not lower than the annular abutting surface E3351. The elastic annular enclosed member E336 is disposed on the annular abutting surface E3351, and the elastic annular enclosed member E336 correspondingly surrounds the contacting structure E331. The elastic annular enclosed member E336 can be made of a material that can return to an initial shape after being pressed (e.g., rubber). A sectional shape of the elastic annular enclosed member E336 can be circular, oblong, or trapezoidal, and the present disclosure is not limited thereto.

Referring to FIG. 23 to FIG. 25, when the contacting structure E331 presses the side surfaces of the chips C carried by the chip testing device 1, a part of the contacting structure E331 simultaneously presses the abutting surface 1114 of the first fixing member 111, the elastic annular enclosed member E336 correspondingly presses the abutting surface 1114 of the first fixing member 111, the contacting structure E331, the first fixing member 111, the pressing structure 113, and the circuit board 10 jointly define an enclosed space SP, and the electrical connection sockets 2 are correspondingly arranged in the enclosed space SP.

When the contacting structure E331 presses the side surfaces of the chips C carried by the chip testing device 1 and the electrical connection sockets 2 are correspondingly arranged in the enclosed space SP, the central control device E1 can control the air suction device E34 to suction away air in the enclosed space SP so that the enclosed space SP is in a substantially vacuum state. In a process where the air suction device E34 suctions away the air, the chip testing device 1 and the pressing device E33 are affected by a negative pressure so as to more tightly abut against each other.

Referring to FIG. 14 and FIG. 15, in a practical application, the contacting structure E331 and the frame body E335 can jointly define an air suction gap G there-between. The air suction gap G can surround the contacting structure E331, the frame body E335 can have a plurality of air suction holes E3352 in spatial communication with the air suction gap G (e.g., the frame body E335 can have a corresponding tunnel inside thereof), and the air suction holes E3352 are configured to be in spatial communication with the air suction device E34. In the present embodiment, the air suction gap G substantially surrounds the contacting structure E331, but as long as the enclosed space SP can be in spatial communication with the air suction device E34 through the air suction gap G and the air suction holes E3352, the present disclosure does not limit the specific disposed position and structure of the air suction gap G. In addition, the quantity, structure, disposed position of the air suction holes E3352 can be changed according to practical requirements.

It is worth mentioning that in a practical application, when the chip testing device 1 is disposed in one of the accommodating chambers E311, the central control device E1 can control the lift device E32 to move a predetermined distance so that the chip testing device 1 moves to a position where the chip testing device 1 is in contact with the pressing device E33. In other words, the elastic annular enclosed member E336 is in contact with the abutting surface 1114 of the chip testing device 1. Afterwards, the central control device E1 can control the air suction device E34 and the lift device E32 to be simultaneously operated so that the enclosed space SP is gradually in a substantial vacuum state. Therefore, the contacting structure E331 presses the lift structure 22 of each of the electrical connection sockets 2 so that the lift structure 22 moves into the corresponding electrical connection socket 2.

In a practical application, the central control device E1 can control the air suction device E34 to suction away the air in the enclosed space SP at a predetermined time that is determined according to design requirements. For example, through at least one sensor (e.g., an optical sensor or a mechanical compression sensor) that is arranged in the accommodating chamber E311 (as shown in FIG. 17), the central control device E1 can determine whether or not the chip testing device 1 is disposed in the accommodating chamber E311 at the predetermined position. After the central control device E1 determines that the chip testing device 1 is in the accommodating chamber E311 at the predetermined position through the at least one sensor, the central control device E1 controls the air suction device E34 to suction away the air in the enclosed space SP.

As shown in FIG. 15, FIG. 23 and FIG. 24, since the outer surface 2111 of each of the electrical connection sockets 2 is flush with the abutting surface 1114, the contacting surface E3314 of the contacting structure E331 is flush with the annular abutting surface E3351 (or the contacting surface E3314 is not lower than the annular abutting surface E3351), and the elastic annular enclosed member E336 is disposed on the annular abutting surface E3351, a force for the lift device E32 pushing the chip testing device 1 can be effectively decreased with the operation of the air suction device E34. Specifically, the lift device E32 allows the chip testing device 1 to move toward the contacting structure E331 of the pressing device E33 and allows the contacting structure E331 to be in contact with the chips C on the electrical connection sockets 2 at the same time. As mentioned above, when the contacting structure E331 is in contact with the chips C on the electrical connection sockets 2, the lift device E32 resists the elastic returning force generated by the elastic assemblies 24 of each of the electrical connection sockets 2 being pressed and the elastic returning force generated by each of probe assemblies 20 of the electrical connection sockets 2 being pressed. Therefore, since the air suction device E34 suctions away the air in the enclosed space SP so that the enclosed space is in a substantially vacuum state, the force for the lift devices E32 to push the chip testing device 1 can be effectively decreased.

It is worth mentioning that according to the description about the chip testing device 1, only the circuit board screwing holes 103 penetrate through the circuit board 10 of the chip testing device 1. Therefore, when the pressing device E33 abuts against the first fixing member 111, a tightness of the enclosed space SP can be easily controlled, and when the air suction device E34 suctions away the air in the enclosed space SP, the enclosed space SP can easily be in a substantial vacuum state. That is to say, in the chip testing device 1 of the present disclosure, through the first fixing member 111 and the second fixing member 112, the number of the thru-holes of the circuit board 10 can be effectively decreased so that when the air suction device E34 suctions away the air in the enclosed space SP, the enclosed space SP can easily be in a substantially vacuum state.

Figure 26:
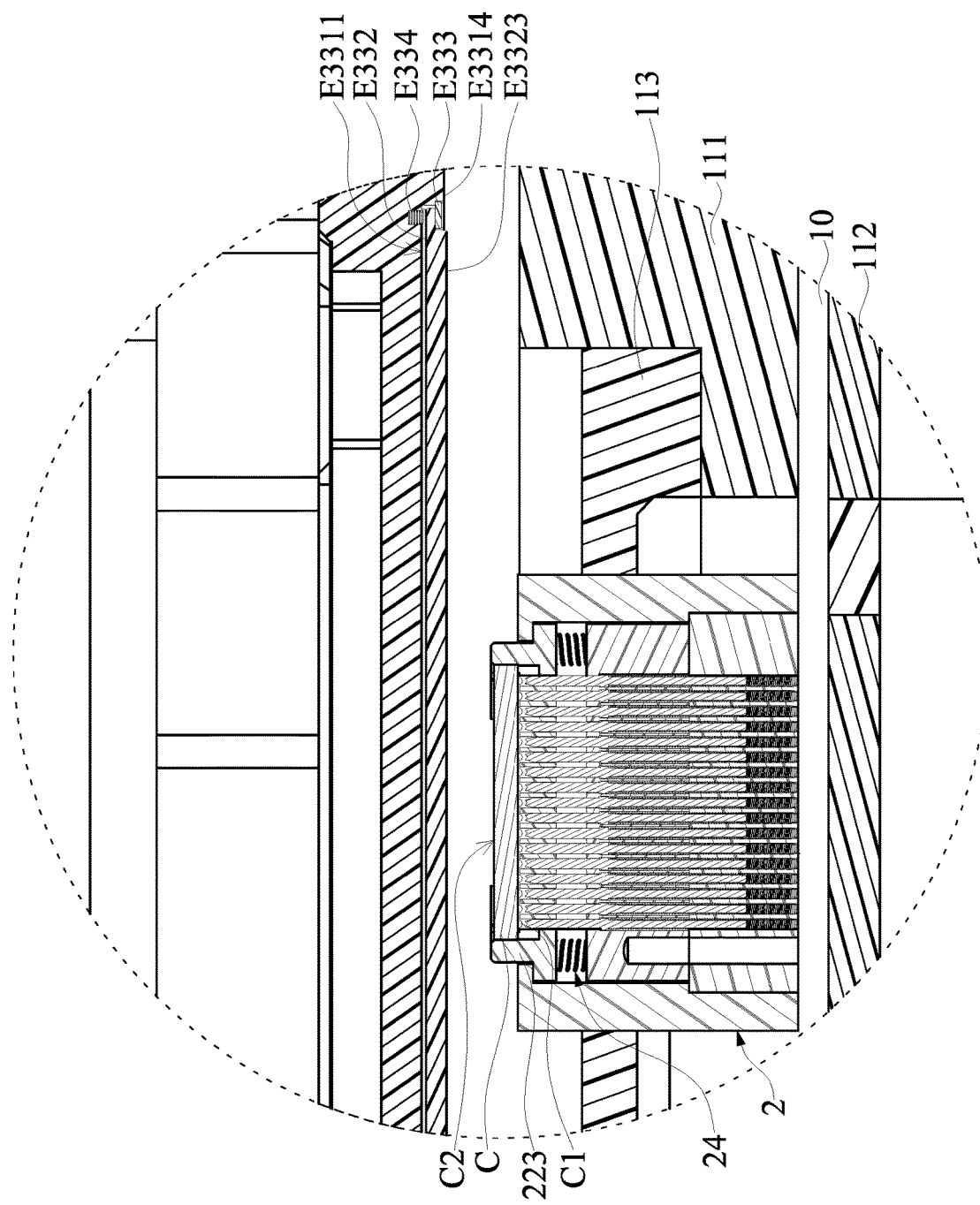
FIG. 26 is a sectional side view of the pressing device and the chip testing device separating from each other of the present disclosure.

Referring to FIG. 26, FIG. 26 is a sectional side view of the pressing device and the chip testing device separating from each other of the present disclosure. When the chips C carried by the chip testing device 1 finish the predetermined testing process performed by the chip testing device 1 and the environment control device E11 controls the lift device E32 to be operated so that the chip testing device 1 moves away from the pressing device E33, the elastic returning force generated by each of the pressed elastic members E334 enables the movable members E332 to move in the move slots E3311. The pushing surfaces E3323 of the movable members E332 that are originally flush with the contacting surface E3314 or arranged in the move slots E3311 protrude from the contacting surface E3314, and the chips C originally abut against the contacting surface E3314 and the annular abutting surface E3351 are pushed by the movable members E332 and are no longer in contact with the contacting surface E3314. Therefore, through the movable members E332, in a process where the chip testing device 1 and the pressing device E33 separate with each other, each of the chips C does not easily adhere to the contacting surface E3314 of the contacting structure E331.

It should be noted that in an embodiment of the present disclosure that the pressing device E33 is provided without the elastic members E334, as long as the movable members E332 of the pressing device E33 face toward the ground, each of the movable members E332 can spontaneously protrude from the contacting surface E3314 by gravity in a process where the pressing device E33 and the chip testing device 1 separate from each other. The chips C originally in contact with the contacting surface E3314 can be similarly pushed so as to similarly prevent the issue of the chips C adhering to the contacting surface E3314.

Referring to FIG. 3 and FIG. 16, in the present embodiment, the pressing device E33 includes twenty-four movable members E332 and eight retaining members E333, and four of the movable members E332 are configured to abut against twelve of the chips C carried by the electrical connection sockets 2. In other words, each of the movable members E332 correspondingly abuts against three of the chips C. However, in a practical application, the quantity of the movable members E332 and the quantity of the retaining portions E333 included by the pressing device E33 are not limited by those shown in FIG. 3 and FIG. 16. In addition, the quantity of the chips C abutted by each of the movable members E332 is not limited to be three and can be changed according to practical requirements.

In a practical application, a contacting surface between each of the movable members E332 and the corresponding chips C is less than a side surface C2 of the chip C opposite to the electrical connection socket 2. For example, the contacting surface between each of the movable members E332 and the corresponding chips C can be lower than 10% of the side surface C2 of the chip C. Preferably, the contacting surface between each of the movable members E332 and the corresponding chips C can be 5% of the side surface C2 of the chip C. Whether or not the elastic members E334 are disposed in the pressing device E33 can be determined according to the contacting surface between each of the movable members E332 and each of the chips C.

Referring to FIG. 1 and FIG. 2, the transferring apparatus E4 is disposed among the environment control apparatuses E3, and the transferring apparatus E4 is configured to transfer the chip testing device 1. The transferring apparatus E4 can include a robot arm and a holding assembly, and the holding assembly is configured to hold the chip testing device 1. The central control device E1 is connected to the transferring apparatus E4, and the central control device E1 is configured to control the transferring apparatus E4 to transfer the chip testing device 1 carrying the chips C into any one of the accommodating chambers E311 (as shown in FIG. 17) of any one of the environment control apparatuses E3. Relatively, the transferring apparatus E4 can be also controlled by the central control device E1 to move the chip testing device 1 disposed in any one of the accommodating chambers E311 out of the accommodating chamber E311.

The classification apparatus E5 is connected to the central control device E1, and is controllable by the central control device E1 to detach the chips C from the electrical connection sockets 2 of the chip testing device 1. Moreover, the classification apparatus E5 can place the chips C at a good product region A1 of a tray or a defective product region A2 of a tray according to test results of the chips C from the predetermined testing process. The classification apparatus E5 can include a robotic arm. In an embodiment of the present disclosure, the classification apparatus E5 and the chip mounting apparatus E2 are arranged adjacent to each other, and are configured to share the same robotic arm. In a practical application, the good product region A1 can be divided into a plurality of sub-regions according to design requirements, and the classification apparatus E5 can place the chips C at different sub-regions of the good product region A1 according to the test results of the chips C from the predetermined testing process. For example, the chips C can be classified according to the working performance thereof.

In conclusion, in the environment control apparatus and the chip testing system including the environment control apparatus of the present disclosure, since the pressing device has the move slots, and the movable members are disposed in the move slots, when the pressing device and the chips disposed on the chip testing device separate from each other, parts of the movable members protruding from the contacting surface of the contacting structure can push the chips. Therefore, the issue of the chips adhering to the pressing device can be effectively improved, or even solved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An environment control apparatus, comprising:
   an environment control device;
   an apparatus body including at least one accommodating chamber, wherein the at least one accommodating chamber is configured to accommodate a chip testing device, the chip testing device is configured to carry a plurality of chips, the environment control device is configured to be electrically connected to the chip testing device disposed in the at least one accommodating chamber, and the environment control device is configured to perform a testing operation to the chips carried by the chip testing device through the chip testing device; and
   a pressing device disposed in the at least one accommodating chamber, wherein the pressing device includes:
      a contacting structure including a plurality of move slots, wherein each of the move slots is formed by a contacting surface of the contacting structure being recessed along a longitudinal direction;
      a plurality of movable members each correspondingly disposed in one of the move slots, wherein one side of each of the movable members opposite to the corresponding move slot has a pushing surface, and wherein each of the movable members is configured to move in the corresponding move slot along the longitudinal direction, and when each of the movable members moves in the corresponding move slot, the pushing surface of each of the movable members protrudes from the contacting surface; and
      a plurality of retaining members fixed to the contacting structure, wherein the retaining members are disposed near the move slots, and the retaining members and the contacting structure are configured to jointly limit a range of movement of the plurality of movable members in the corresponding move slots;
   wherein, when the chip testing device is disposed in the at least one accommodating chamber, the pressing device is correspondingly arranged above the chips carried by the chip testing device,
   wherein the environment control device is configured to allow the chip testing device disposed in the at least one accommodating chamber and the pressing device arranged in the at least one accommodating chamber to move toward each other, and the environment control device is configured to allow the pushing surfaces of the movable members and the contacting surface to abut against a plurality of side surfaces of the chips together, and
   wherein, when the pushing surfaces of the movable members and the contacting surface abut against the side surfaces of the chips together, the environment control device is configured to move the chip testing device disposed in the at least one accommodating chamber and the pressing device arranged in the at least one accommodating chamber away from each other, and the movable members correspondingly protrude from the contacting surface and push the chips originally in contact with the contacting surface.

2. The environment control apparatus according to claim 1, wherein a height of each of the movable members along the longitudinal direction is equal to or less than a depth of each of the move slots, and each of the movable members is configured to move into a corresponding one of the move slots, and wherein, when each of the movable members moves into the corresponding one of the move slots, the pushing surface of each of the movable members is configured to be flush with the contacting surface.

3. The environment control apparatus according to claim 1, wherein the pressing device further includes a plurality of elastic members disposed in the move slots, one end of each of the elastic members is fixed to the contacting structure, and one side of each of the movable members arranged in the corresponding one of the move slots is connected to at least one of the elastic members arranged in the corresponding one of the move slots, wherein, when the pushing surface of each of the movable members does not abut against the chips, at least one of the elastic members arranged in the corresponding one of the move slots is in a pressed state, and each of the elastic members allows the movable member connected thereto to partially protrude from the contacting surface, and wherein the contacting structure further includes a plurality of spring accommodating slots, each of the spring accommodating slots is defined by a bottom wall of each of the move slots recessed in a direction away from the contacting surface, each of the move slots is in spatial communication with at least two of the spring accommodating slots, and each of the spring accommodating slots is configured to accommodate one of the elastic members.

4. The environment control apparatus according to claim 1, wherein the move slots are arranged side by side on the contacting structure, the contacting structure further includes a plurality of retaining slots, each of the retaining slots is formed by the contacting surface being recessed along the longitudinal direction, two ends of each of the move slots are respectively in spatial communication with two of the retaining slots, and a depth of each of the retaining slots is less than a depth of each of the move slots.

5. The environment control apparatus according to claim 4, wherein each of the movable members has a pushing portion and two retaining portions, and the pushing portion is disposed in the corresponding one of the move slots, and wherein, when the pressing device faces toward the chip testing device disposed in the at least one accommodating chamber, the two retaining portions of each of the movable members respectively abut against two of the retaining members, and a part of the pushing portion protrudes from the contacting surface.

6. The environment control apparatus according to claim 1, further comprising a temperature adjusting device connected to the pressing device, wherein the temperature adjusting device is electrically connected to the environment control device, and wherein the environment control device is configured to control the temperature adjusting device to be operated so that a temperature of the contacting surface of the contacting structure reaches a predetermined high temperature or a predetermined low temperature.

7. The environment control apparatus according to claim 6, wherein the pressing structure further includes:
a frame body surrounding the contacting structure, wherein the frame body has an annular abutting surface flush with or lower than the contacting surface; and
an elastic annular enclosed member disposed on the annular abutting surface, wherein, when the contacting surface is in contact with the side surfaces of the chips carried by the chip testing device, the elastic annular enclosed member correspondingly abuts against the chip testing device, so that the contacting structure and the chip testing device jointly define an enclosed space there-between,
wherein the environment control apparatus is connected to an air suction device, and the environment control device is configured to control the air suction device to suction away air in the enclosed space, and
wherein the frame body and the contacting structure jointly define at least one air suction gap there-between, the frame body includes at least one air suction hole that is in spatial communication with the at least one air suction gap, and the air suction device is configured to suction away the air in the enclosed space through the at least one air suction hole and the at least one air suction gap.

8. The environment control apparatus according to claim 7, wherein the chip testing device includes at least one first power supply member, the at least one accommodating chamber is provided to have at least one second power supply member disposed therein, and the apparatus body is connected to an external power supply member, wherein, when the chip testing device is disposed in the at least one accommodating chamber, the chip testing device is configured to be provided with electricity by the external power supply member through the at least one first power supply member and the at least one second power supply member, and wherein, when the chip testing device is disposed in the at least one accommodating chamber, the contacting structure abuts against the side surfaces of the chips carried by the chip testing device, and when the chip testing device is provided with electricity, the temperature of the contacting structure reaches the predetermined high temperature or the predetermined low temperature, and the air in the enclosed space is suctioned away by the air suction device, the environment control device is configured to control the chip testing device to perform a predetermined testing process to the chips carried by the chip testing device.

9. The environment control apparatus according to claim 1, further comprising at least one lift device disposed in the at least one accommodating chamber, wherein the at least one lift device is connected to the environment control device, and wherein the environment control device is configured to control the at least one lift device to be operated so that the chip testing device disposed in the at least one accommodating chamber moves toward or away from the pressing device disposed in the at least one accommodating chamber.

10. A chip testing system, comprising:
a chip testing device configured to carry a plurality of chips;
a central control device including at least one environment control device; and
at least one environment control apparatus including:
an apparatus body including at least one accommodating chamber, wherein the at least one accommodating chamber is configured to accommodate the chip testing device, the chip testing device is configured to carry the chips, the at least one environment control device is configured to be electrically connected to the chip testing device disposed in the at least one accommodating chamber, and the at least one environment control device is configured to perform a testing operation to the chips carried by the chip testing device through the chip testing device; and
a pressing device disposed in the at least one accommodating chamber, wherein the pressing device includes:
a contacting structure including a plurality of move slots, wherein each of the move slots is formed by a contacting surface of the contacting structure being recessed along a longitudinal direction;
a plurality of movable members each correspondingly disposed in one of the move slots, wherein one side of each of the movable members opposite to the corresponding move slot has a pushing surface, and wherein each of the movable members is configured to move in the corresponding move slot along the longitudinal direction, and when each of the movable members moves in the corresponding move slot, the pushing surface of each of the movable members protrudes from the contacting surface; and
a plurality of retaining members fixed to the contacting structure, wherein the retaining members are disposed near the move slots, and the retaining members and the contacting structure are configured to jointly limit a range of movement of the plurality of the movable members in the corresponding move slots,
wherein, when the chip testing device is disposed in the at least one accommodating chamber, the pressing device is correspondingly arranged above the chips carried by the chip testing device,
wherein the at least one environment control device is configured to allow the chip testing device disposed in the at least one accommodating chamber and the pressing device arranged in the at least one accommodating chamber to move toward each other, and the at least one environment control device is configured to allow the pushing surfaces of the movable members and the contacting surface to abut against a plurality of side surfaces of the chips together,
wherein, when the pushing surfaces of the movable members and the contacting surface abut against the side surfaces of the chips together, the at least one environment control device is configured to move the chip testing device disposed in the at least one accommodating chamber and the pressing device arranged in the at least one accommodating chamber away from each other, and the movable members correspondingly protrude from the contacting surface and push the chips originally in contact with the contacting surface, and wherein, when the chip testing device is disposed in the at least one of the accommodating chamber and the pushing surfaces of the movable members and the contacting surface abut against the side surface of the chips together, the central control device is configured to control the chip testing device to perform a predetermined testing process to the chips.

11. The chip testing system according to claim 10, wherein a height of each of the movable members along the longitudinal direction is equal to or less than a depth of each of the move slots, and each of the movable members is configured to move into a corresponding one of the move slots, and wherein, when each of the movable members moves into the corresponding one of the move slot, the pushing surface of each of the movable members is configured to be flush with the contacting surface.

12. The chip testing system according to claim 10, wherein the pressing device further includes a plurality of elastic members disposed in the move slots, one end of each of the elastic members is fixed to the contacting structure, and one side of each of the movable members arranged in the corresponding one of the move slots is connected to at least one of the elastic members arranged in the corresponding one of the move slots, and wherein, when the pushing surface of each of the movable members does not abut against the chips, at least one of the elastic members arranged in the corresponding one of the move slots is in a pressed state, and each of the elastic members allows the movable member connected thereto to partially protrude from the contacting surface.

13. The chip testing system according to claim 12, wherein the contacting structure further includes a plurality of spring accommodating slots, each of the spring accommodating slots is defined by a bottom wall of each of the move slots recessed in a direction away from the contacting surface, each of the move slots is in spatial communication with at least two of the spring accommodating slots, and each of the spring accommodating slots is configured to accommodate one of the elastic members, and wherein the move slots are arranged side by side on the contacting structure, the contacting structure further includes a plurality of retaining slots, each of the retaining slots is formed by the contacting surface being recessed along the longitudinal direction, two ends of each of the move slots are respectively in spatial communication with two of the retaining slots, and a depth of each of the retaining slots is less than a depth of each of the move slots.

14. The chip testing system according to claim 13, wherein each of the movable members has a pushing portion and two retaining portions, and the pushing portion is disposed in the corresponding one of the move slots, and wherein, when the pressing device faces toward the chip testing device disposed in the at least one accommodating chamber, the two retaining portions of each of the movable members respectively abut against two of the retaining members, and a part of the pushing portion protrudes from the contacting surface.

15. The chip testing system according to claim 10, wherein the at least one environment control apparatus further includes a temperature adjusting device connected to the pressing device, the temperature adjusting device is electrically connected to the at least one environment control device, and the at least one environment control device is configured to control the temperature adjusting device to be operated so that a temperature of the contacting surface of the contacting structure reaches a predetermined high temperature or a predetermined low temperature.

16. The chip testing system according to claim 15, wherein the pressing device further includes:
a frame body surrounding the contacting structure, wherein the frame body has an annular abutting surface flush with or lower than the contacting surface; and
an elastic annular enclosed member disposed on the annular abutting surface, wherein, when the contacting surface is in contact with the side surfaces of the chips carried by the chip testing device, the elastic annular enclosed member correspondingly abuts against the chip testing device, so that the contacting structure and the chip testing device jointly define an enclosed space there-between,
wherein the environment control apparatus is connected to an air suction device, and the environment control device is configured to control the air suction device to suction away air in the enclosed space, and
wherein the frame body and the contacting structure jointly define at least one air suction gap there-between, the frame body includes at least one air suction hole that is in spatial communication with the at least one air suction gap, and the air suction device is configured to suction away the air in the enclosed space through the at least one air suction hole and the at least one air suction gap.

17. The chip testing system according to claim 16, wherein the chip testing device includes at least one first power supply member, the at least one accommodating chamber is provided to have at least one second power supply member disposed therein, and the apparatus body is connected to an external power supply member, wherein, when the chip testing device is disposed in the at least one accommodating chamber, the chip testing device is configured to be provided with electricity by the external power supply member through the at least one first power supply member and the at least one second power supply member, and wherein, when the chip testing device is disposed in the at least one accommodating chamber, the contacting structure abuts against the side surfaces of the chips carried by the chip testing device, and when the chip testing device is provided with electricity, the temperature of the contacting structure reaches the predetermined high temperature or the predetermined low temperature, and the air in the enclosed space is suctioned away by the air suction device, the environment control device is configured to control the chip testing device to perform the predetermined testing process to the chips carried by the chip testing device.

18. The chip testing system according to claim 10, wherein the at least one environment control apparatus further includes at least one lift device disposed in the at least one accommodating chamber, wherein the at least one lift device is connected to the at least one environment control device, and wherein the at least one environment control device is configured to control the at least one lift device to be operated so that the chip testing device disposed in the at least one accommodating chamber moves toward or away from the pressing device disposed in the at least one accommodating chamber.

19. The chip testing system according to claim 10, wherein the chip testing device includes:
at least one circuit board having a first board surface and a second board surface respectively defined by two opposite sides thereof;
a plurality of electrical connection sockets disposed on the first board surface, wherein each of the electrical connection sockets includes:

a socket body having a top wall and an annular wall, wherein the top wall has an opening, one end of the annular wall is connected to a peripheral edge of the top wall, and another end of the annular wall abuts against the at least one circuit board, wherein the top wall, the annular wall, and the at least one circuit board jointly define an accommodating slot, the top wall has an outer surface and an inner surface respectively defined by two opposite sides thereof, and the inner surface is arranged in the accommodating slot, and wherein one side of the top wall opposite to the at least one circuit board is defined as the outer surface, and the outer surface is flush with an abutting surface of the first fixing member opposite to the at least one circuit board;

a supporting structure abutting against the at least one circuit board and arranged in the accommodating slot, wherein the supporting structure includes a plurality of positioning holes, and each of the positioning holes is provided with a positioning member disposed therein;

a lift structure disposed in the accommodating slot and having a base portion and a carrying portion, wherein the base portion is arranged in the accommodating slot and extends to form the carrying portion, at least part of the carrying portion is arranged in the opening, and the carrying portion extends in a direction away from the base portion to form a plurality of retaining portions, wherein at least part of each of the retaining portions protrudes from the opening, and the retaining portions and the carrying portion jointly define a chip receiving slot for receiving one of the chips, and wherein the lift structure has a plurality of connection holes penetrating through the base portion and the carrying portion;

at least one elastic assembly disposed in the accommodating slot, wherein one end of the at least one elastic assembly is fixed to the lift structure, and another end of the at least one elastic assembly is fixed to the supporting structure, and wherein the at least one elastic assembly is configured to generate an elastic returning force by being pressed so as to allow the base portion to abut against the inner surface of the top wall and allow a gap to be formed between the lift structure and the supporting structure; and a plurality of probe assemblies each fixed to the supporting structure through one end thereof, wherein another end of the probe assemblies abuts against a plurality of electrical contacting structures of the at least one circuit board and is arranged in the connection holes, wherein in each of the electrical connection sockets, when the chip receiving slot receives the corresponding chip, and the retaining portions are not pressed by the pressing device, the probe assemblies in the connection holes are not in contact with a plurality of electrical connection portions of the corresponding chip, and a part of the lift structure protrudes from the outer surface of the top wall, and wherein in each of the electrical connection sockets, when the chip receiving slot receives the corresponding chip, the retaining portions are pressed to move into the socket body by the contacting structure and the elastic annular enclosed member and the abutting surface of the first fixing member abut against each other, the probe assemblies are in contact with the electrical connection portions of the corresponding chip; and a control set disposed on the second board surface of the at least one circuit board, wherein the control set includes a plurality of testing modules, and each of the testing modules is connected to a portion of the electrical connection sockets.

* * * * *